(12) United States Patent
Lee et al.

(10) Patent No.: US 9,570,316 B2
(45) Date of Patent: Feb. 14, 2017

(54) METHOD OF MANUFACTURING SEMICONDUCTOR DEVICE

(71) Applicant: Samsung Electronics Co., Ltd., Suwon-si, Gyeonggi-do (KR)

(72) Inventors: Mong-sup Lee, Hwaseong-si (KR); Sang-jun Lee, Incheon (KR); Yoon-ho Son, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 51 days.

(21) Appl. No.: 14/718,293

(22) Filed: May 21, 2015

(65) Prior Publication Data
US 2015/0340281 A1   Nov. 26, 2015

(30) Foreign Application Priority Data
May 23, 2014  (KR) .......................... 10-2014-0062588

(51) Int. Cl.
| | | |
|---|---|---|
| H01L 21/311 | (2006.01) | |
| H01L 21/764 | (2006.01) | |
| H01L 21/768 | (2006.01) | |
| H01L 27/108 | (2006.01) | |
| H01L 21/66  | (2006.01) | |

(52) U.S. Cl.
CPC .... *H01L 21/31111* (2013.01); *H01L 21/31116* (2013.01); *H01L 21/764* (2013.01); *H01L 21/7682* (2013.01); *H01L 21/76895* (2013.01); *H01L 21/76897* (2013.01); *H01L 27/10855* (2013.01); *H01L 27/10885* (2013.01); *H01L 22/12* (2013.01); *H01L 22/20* (2013.01)

(58) Field of Classification Search
CPC ............. H01L 21/311; H01L 21/31111; H01L 21/31116; H01L 21/764; H01L 21/7682; H01L 21/76897
See application file for complete search history.

(56) References Cited

U.S. PATENT DOCUMENTS

| | | |
|---|---|---|
| 7,811,924 B2 | 10/2010 | Cui et al. |
| 7,994,046 B2 | 8/2011 | Jeng |

(Continued)

FOREIGN PATENT DOCUMENTS

| | | |
|---|---|---|
| JP | 2009-123776 A | 6/2009 |
| JP | 2011-165876 A | 8/2011 |

(Continued)

*Primary Examiner* — Raj R Gupta
(74) *Attorney, Agent, or Firm* — Harness, Dickey & Pierce, P.L.C.

(57) ABSTRACT

A method of manufacturing a semiconductor device includes forming a first conductive structure on a substrate, forming an insulation layer on a sidewall of the first conductive structure, forming a second conductive structure a distance apart from the first conductive structure with the insulation layer therebetween, first removing a portion of the insulation layer by performing a first dry cleaning operation, second removing a reactant product used in the first dry cleaning operation or a first byproduct generated as a result of the first dry cleaning operation by performing a first purge operation, and third removing at least a portion of the remaining insulation layer by performing a second dry cleaning operation to form an air gap between the first and second conductive structures.

14 Claims, 23 Drawing Sheets

(56) References Cited

U.S. PATENT DOCUMENTS

| | | |
|---|---|---|
| 8,143,109 B2 | 3/2012 | Yan |
| 8,389,376 B2 | 3/2013 | Demos et al. |
| 8,409,399 B2 | 4/2013 | LaFlamme, Jr. et al. |
| 8,592,272 B2 | 11/2013 | Matsuno |
| 2009/0061632 A1* | 3/2009 | Summerfelt ...... H01L 21/31111 438/694 |
| 2009/0121356 A1 | 5/2009 | Nakagawa |
| 2011/0180910 A1* | 7/2011 | Kim ................ H01L 21/2256 257/623 |
| 2012/0146122 A1 | 6/2012 | Whang et al. |
| 2013/0052787 A1* | 2/2013 | Lee ................ H01L 27/10852 438/381 |
| 2013/0122684 A1* | 5/2013 | Hsuan .............. H01L 21/02057 438/400 |
| 2013/0277730 A1 | 10/2013 | Jung et al. |

FOREIGN PATENT DOCUMENTS

| | | |
|---|---|---|
| JP | 2011-243639 A | 12/2011 |
| KR | 10-2009-0130836 A | 12/2009 |
| KR | 10-2010-0112889 A | 10/2010 |
| KR | 10-2012-0066331 A | 6/2012 |
| KR | 10-2013-0118559 A | 10/2013 |

* cited by examiner

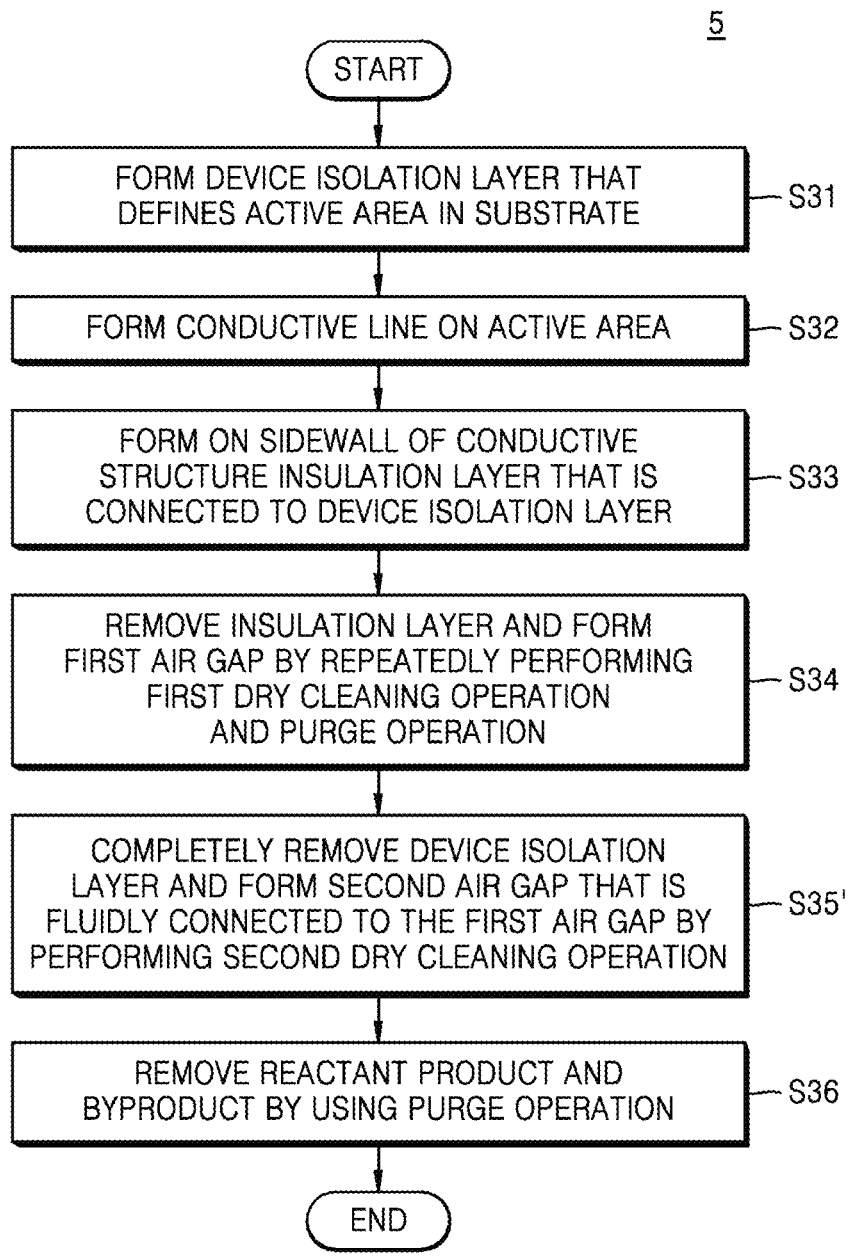

METHOD OF MANUFACTURING SEMICONDUCTOR DEVICE

CROSS-REFERENCE TO RELATED APPLICATIONS

This application claims the benefit of Korean Patent Application No. 10-2014-0062588, filed on May 23, 2014, in the Korean Intellectual Property Office, the disclosure of which is incorporated herein in its entirety by reference.

BACKGROUND

1. Field

Some example embodiments of the inventive concepts relate to a method of manufacturing a semiconductor device, and more particularly, to a method of manufacturing a semiconductor device including an air gap formed between conductive layers thereof.

2. Description of the Related Art

When a relatively high integration semiconductor device is manufactured, a parasitic capacitance component is generated between adjacent layers thereof, thereby degrading the performance and reliability of the semiconductor device.

To reduce the parasitic capacitance component, a dielectric material having a low dielectric constant may be interposed between the adjacent layers. In this case, a space between the adjacent layers may be kept as an air gap to effectively further reduce the parasitic capacitance between the adjacent layers.

SUMMARY

Some example embodiments of the inventive concepts provide a method of manufacturing a semiconductor device including an air gap formed at a target position without damaging adjacent conductive layers.

According to an example embodiment of the inventive concepts, a method of manufacturing a semiconductor device includes forming a first conductive structure on a substrate, forming an insulation layer on a sidewall of the first conductive structure, forming a second conductive structure a distance apart from the first conductive structure with the insulation layer therebetween, first removing a portion of the insulation layer by performing a first dry cleaning operation, second removing a reactant product used in the first dry cleaning operation or a first byproduct generated as a result of the first dry cleaning operation by performing a first purge operation, and third removing at least a portion or all of the remaining insulation layer by performing a second dry cleaning operation to form an air gap between the first and second conductive structures.

Only a portion of the remaining insulating layer may be removed in the second dry cleaning operation, and the second dry cleaning operation and the first purge operation may be repeatedly performed until the air gap has at least one of a target width and a target depth.

Repeatedly performing the second dry cleaning operation and the first purge operation may include repeatedly supplying an etching gas and stopping the supply of the etching gas to sublimate a second byproduct generated as a result of the second dry cleaning operation and the first purge operation.

The method may further include determining whether removal of a second byproduct is required after the second dry cleaning operation, and performing a second purge operation at a temperature higher than a temperature of the second dry cleaning operation to sublimate the second byproduct if removal of the second byproduct is required.

A temperature of the first purge operation may be higher than a temperature of the second dry cleaning operation.

The first purge operation may be performed while supplying an inert gas or at a pressure adjusted to be lower than a pressure of the first dry cleaning operation and the second dry cleaning operation.

Only a portion of the remaining insulation layer may be removed in the second dry cleaning operation such that the remaining portion of the insulation layer forms the air gap between the first and second conductive structures.

At least one of the first and second conductive structures may include a structure in which different conductive materials are bonded.

The first conductive structure may be a bit line, the second conductive structure may be a buried contact, and the method may further include forming a landing pad pattern to expose the buried contact and a portion of the insulation layer after forming the buried contact, and the first dry cleaning operation and the second dry cleaning operation may be performed after forming the landing pad pattern.

A gas used in the first and second dry cleaning operations may be a plasma-less gas.

A gas used in the first and second dry cleaning operations may include at least one of $NH_3$, HF, $NF_3$, $H_2$, and IPA (isopropyl alcohol).

A gas used in at least one of the first and second dry cleaning operations may include an inert gas.

The method may further include removing a portion of the insulation layer by performing a wet cleaning operation before performing the first dry cleaning operation.

At least one of the first and second conductive structures may include a structure in which different conductive materials are stacked and the remaining insulation layer has an upper surface that is at a level higher than a level of bonding interfaces of the different conductive materials.

According to another example embodiment of the inventive concepts, a method of manufacturing a semiconductor device includes forming a device isolation layer defining an active area in a substrate, forming a conductive structure connected to the active area, forming an insulation layer connected to the device isolation layer on a sidewall of the conductive structure, removing the insulation layer by repeatedly performing a first dry cleaning operation and a purge operation to form a first air gap, and removing the device isolation layer that is fluidly connected to the first air gap by repeatedly performing a second dry cleaning operation and a purge operation to form a second air gap.

The insulation layer and the device isolation layer may be formed of the same material.

According to another example embodiment of the inventive concepts, a method of manufacturing a semiconductor device includes forming a structure on a substrate, the structure including a bit line on the substrate, and an insulation layer on a sidewall of the bit line, and removing at least a portion of the insulation layer by performing at least two cycles of a dry cleaning operation and a purge operation to form an air gap.

The cycles of a dry cleaning operation and purge operation may be performed until the air gap has at least one of a target width and a target depth.

The entire insulating layer may be removed.

At least the portion of the insulation layer may be removed using a gas including at least one of a plasma-less gas, an inert gas, $NH_3$, HF, $NF_3$, $H_2$, and IPA (isopropyl alcohol).

The dry cleaning operation may be performed at a temperature of about 100° C. to about 300° C. and at a pressure of about 0.00001 atm to about 0.3 atm.

BRIEF DESCRIPTION OF THE DRAWINGS

Example embodiments of the inventive concepts will be more clearly understood from the following detailed description taken in conjunction with the accompanying drawings in which:

FIG. 9 is a flowchart of a method of manufacturing a semiconductor device according to yet still another example embodiment of the inventive concepts;

DETAILED DESCRIPTION

Figure 1A:
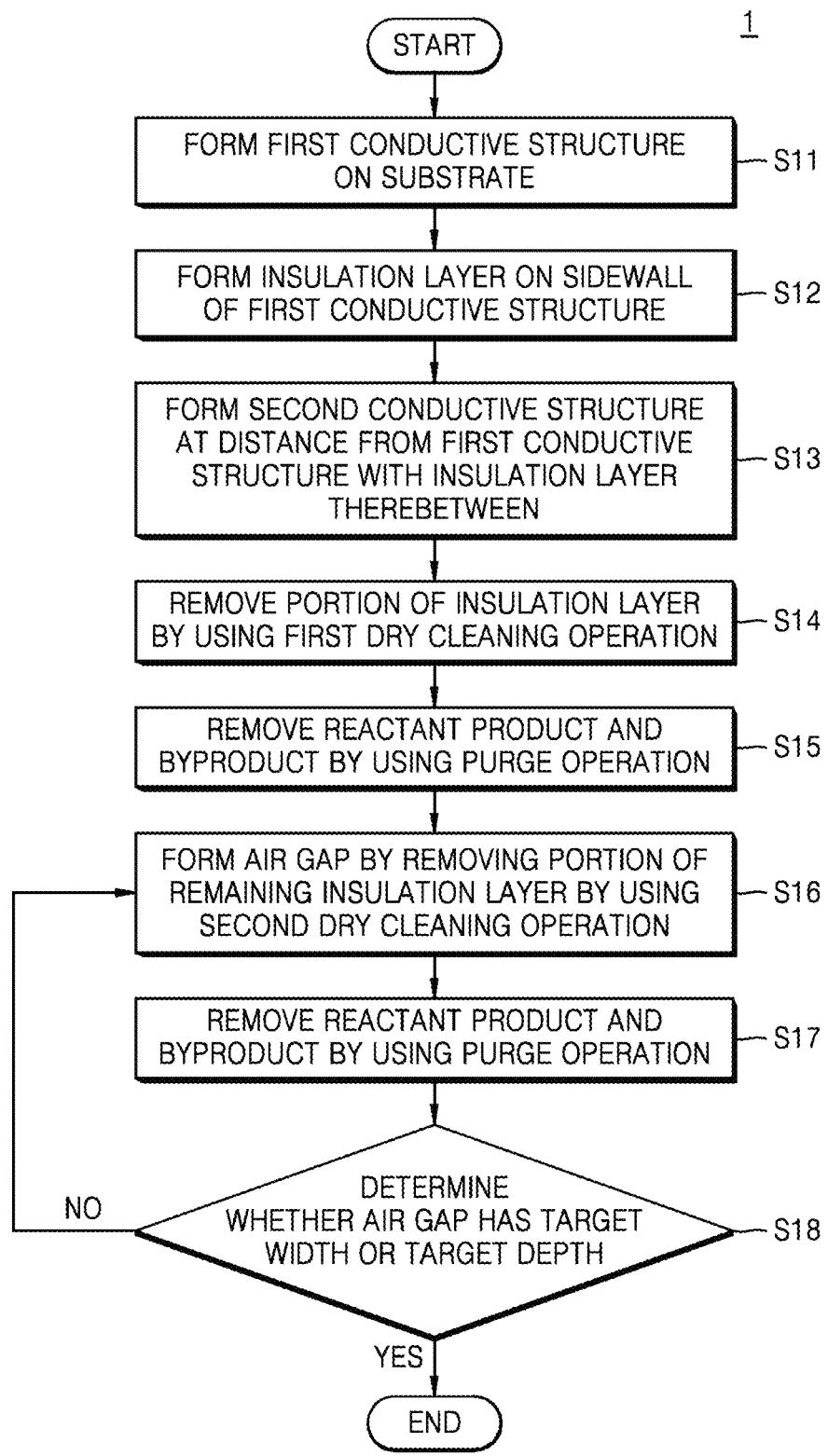
FIGS. 1A through 1C are flowcharts of methods of manufacturing a semiconductor device according to an example embodiment of the inventive concepts.

As used herein, the term "and/or" includes any and all combinations of one or more of the associated listed items. Expressions such as "at least one of," when preceding a list of elements, modify the entire list of elements and do not modify the individual elements of the list.

Hereinafter, the inventive concepts will be described more fully with reference to the accompanying drawings, in which example embodiments are shown. In the drawings, like elements are labeled like reference numerals and repeated description thereof will be omitted.

This inventive concepts may, however, be embodied in many different forms and should not be construed as limited to the example embodiments set forth herein. Rather, these embodiments are provided so that this disclosure will be thorough and complete, and will fully convey the scope of the inventive concepts to those of ordinary skill in the art.

In the present description, terms such as 'first', 'second', etc. are used to describe various members, areas, layers, regions, and/or components. However, it is obvious that the members, areas, layers, regions, and/or components should not be defined by these terms. Also, these terms should not be construed as indicating any particular order or whether an element is at a upper or lower side or at a superior or inferior side, and are used only for distinguishing one member, area, layer, region, or component from another member, area, layer, region, or component. Thus, a first member, area, layer, region, or component which will be described may also refer to a second member, area, layer, region, or component, without departing from the teaching of the inventive concepts. For example, without departing from the scope of the inventive concepts, a first component may be referred to as a second component, and similarly, a second component may be referred to as a first component.

Unless defined differently, all terms used in the description including technical and scientific terms have the same meanings as generally understood by those skilled in the art. Terms commonly used and defined in dictionaries should be construed as having the same meanings as in the associated technical context of the inventive concepts, and unless defined apparently in the description, these terms are not ideally or excessively construed as having formal meanings.

When an example embodiment is implementable in another manner, a given (or, alternatively predetermined) process order may be different from a described one. For example, two processes that are consecutively described may be substantially simultaneously performed or may be performed in an opposite order to the described order.

In the drawings, for example, shapes of the illustrated elements may be modified according to the manufacturing techniques and/or tolerances thereof. Thus, the inventive concepts should not be construed as being limited to the example embodiments set forth herein, and should include, for example, all shape variations caused during the manufacture of the illustrated elements.

FIG. 1A is a flowchart of a method 1 of manufacturing a semiconductor device according to an example embodiment of the inventive concepts.

Referring to FIG. 1A, a first conductive structure is formed on a substrate in operation S11, and an insulation spacer including an insulation material is formed on a sidewall of the first conductive structure in operation S12. In operation S13, a second conductive structure is formed at a certain distance from the first conductive structure with the insulation spacer therebetween. Then, a first dry cleaning operation is performed to remove a part of an upper portion of the insulation spacer in operation S14. A reactant product used in the first dry cleaning operation or a byproduct generated as a result of the first cleaning operation may block an opening of a portion where an air gap is to be formed, and thus, the reactant product or byproduct is removed by performing a purge operation in operation S15. To remove a portion of the remaining insulation spacer, a second dry cleaning operation is performed. As the insulation spacer is removed, an air gap is formed between the first and second conductive structures in operation S16. A purge operation may be performed in operation S17 to remove a reactant product used in the second dry cleaning operation or a byproduct generated as a result of the second dry cleaning operation. Whether the air gap has a target width or depth is determined in operation S18, and the second dry cleaning operation of operation S16 and the purge operation of operation S17 may be repeated until the air gap has the target width or depth.

As the insulation spacer between the first and second conductive structures is removed by using a dry cleaning method, layers of the first and second conductive structures may not be damaged. Also, by repeatedly performing a purge operation and a dry cleaning operation, the opening of the air gap is not blocked early due to the reactant product or the byproduct, and thus, a narrow and deep air gap may be formed.

Figure 1B:
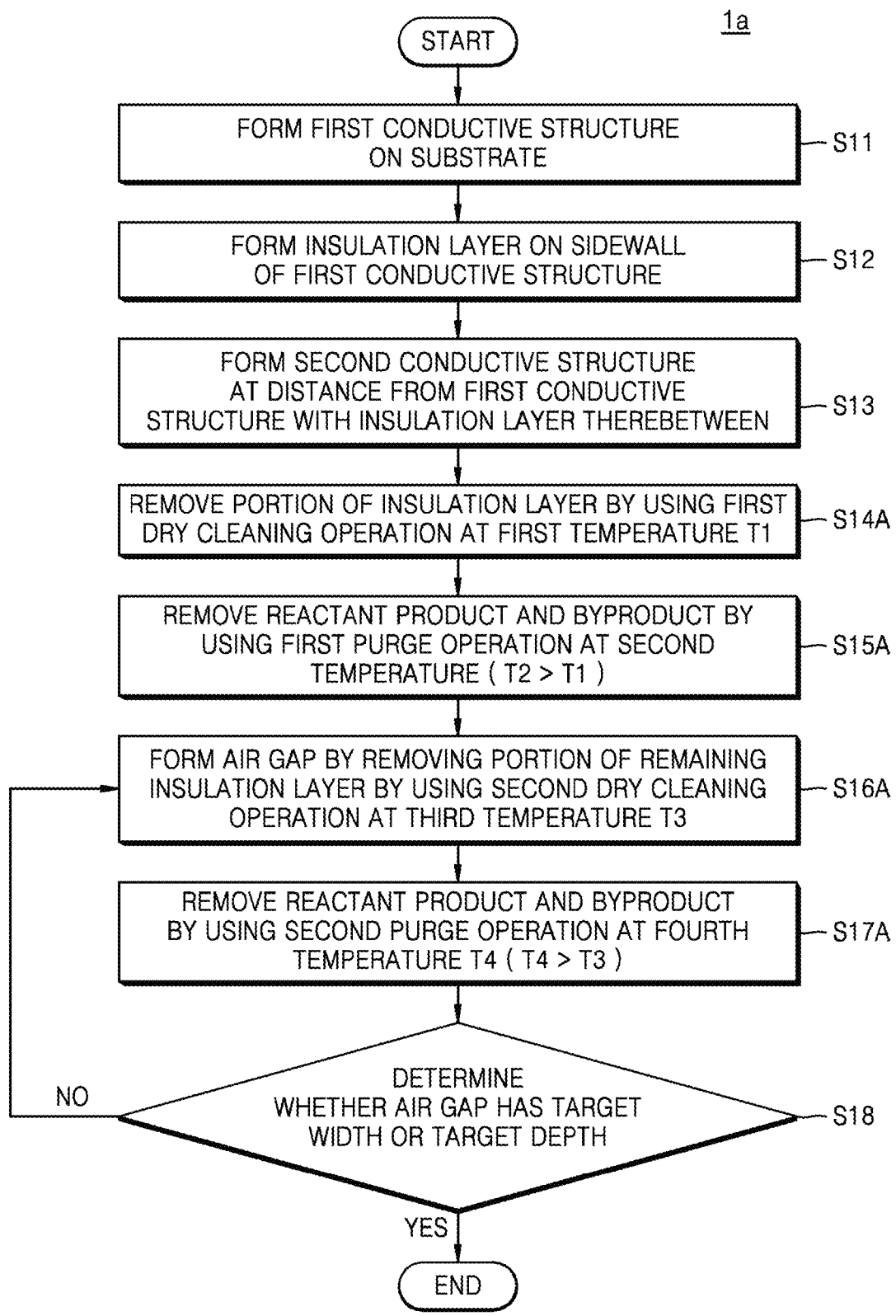

FIG. 1B is a flowchart of a method 1a of manufacturing a semiconductor device according to example embodiments of the inventive concepts. The method of FIG. 1B is an example embodiment of the method 1 of manufacturing a semiconductor device of FIG. 1A and includes operations S14a, S15a, S16a, and S17a, wherein a temperature of a purge operation is higher than a temperature of a dry cleaning operation.

Referring to FIG. 1B, second and fourth temperatures T2 and T4 of first and second purge operations S15a and S17a may be respectively higher than first and third temperatures T1 and T3 of first and second dry cleaning operations S14a and S16a. For example, the first temperature T1 at which the first dry cleaning operation S14a is performed may be about 100 degrees Celsius, and the second temperature T2 at which the first purge operation S15a is performed may be about 120 degrees Celsius or higher.

In detail, the first purge operation S15a may be performed by moving the substrate near a heater disposed in a chamber in which the first dry cleaning operation S14a has been performed or to another chamber of a relatively high temperature. A byproduct generated as a result of the first dry cleaning operation S14a may be sublimated at a relatively high temperature to be removed. After the first relatively high temperature purge operation S15a, a cooling operation may be performed. The cooling operation may be performed by moving the substrate from the heater disposed in the chamber in which the first dry cleaning operation S14a has been performed or by moving the substrate to another relatively low temperature chamber. Next, a second dry cleaning operation S16a and a second purge operation S17a may be performed. Here, the fourth temperature T4 at which the fourth purge operation S17a is performed may be higher than the third temperature T3 at which the second dry cleaning operation S16a is performed.

Figure 1C:
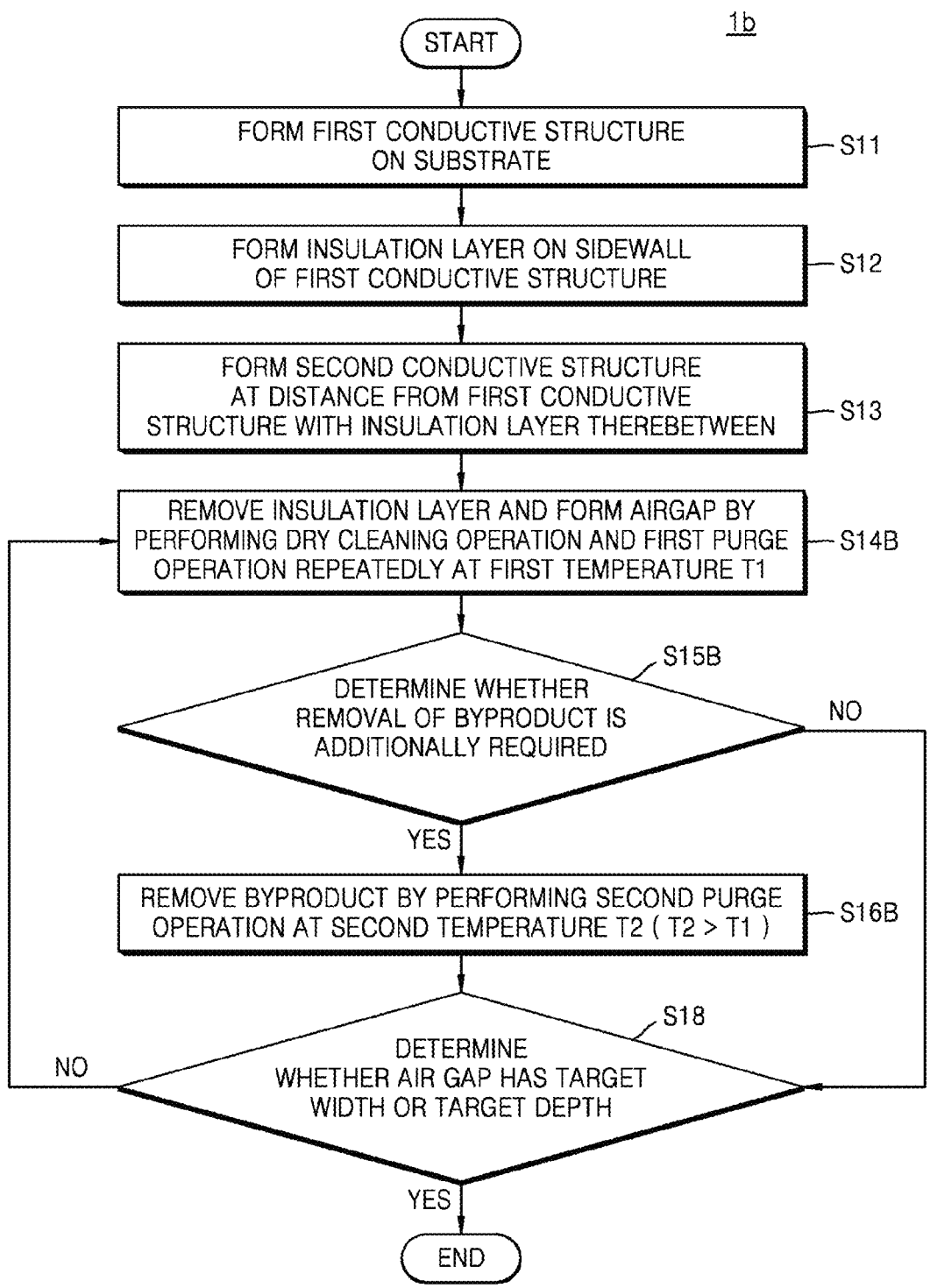

FIG. 1C is a flowchart of a method 1b of manufacturing a semiconductor device according to example embodiments of the inventive concepts. The method of FIG. 1C is an example embodiment of the method 1 of manufacturing a semiconductor device of FIG. 1A, and further includes operation S14b of repeating a dry cleaning operation and a purge operation at a high temperature, operation S15b of determining whether removal of a byproduct is additionally required, and operation S16b of performing an additional purge operation.

Referring to FIG. 1C, operation S14b of repeating a dry cleaning operation and a purge operation may be an operation of repeating supplying an etching gas at the first temperature T1 and stopping the supplying of the etching gas, and a byproduct may be sublimated during this operation. Operation S14b of repeating a dry cleaning operation and a purge operation may be an operation of repeating supplying an etching gas of HF and $NH_3$ or $NF_3$ and $NH_3$ by using a remote plasma method and stopping the supplying of the etching gas. Next, whether removal of a byproduct is additionally required is determined in operation S15b, and if removal of a byproduct is additionally required, operation S16b of performing an additional high-temperature purge operation may be performed at the second temperature T2 which is higher than the first temperature T1.

For example, operation S14b of repeating a dry cleaning operation and a purge operation may be performed at about 100 degrees Celsius, and operation S16b of performing an additional high-temperature purge operation may be performed at a temperature of about 120 degrees Celsius or higher. The operation S16b of performing an additional high-temperature purge operation may be performed by moving the substrate near a heater disposed in a chamber in which a dry cleaning operation has been performed or to another relatively high-temperature chamber. A byproduct generated as a result of the dry cleaning operation may be sublimated at a relatively high temperature to be removed. After operation S16b of performing an additional relatively high-temperature purge operation, a cooling operation may be performed.

In example embodiments, the dry cleaning operation may be performed at a pressure of about 100 mTorr to about 100 Torr, and the purge operation may be performed at a pressure of 100 mTorr or lower. In the above purge operation, as a pressure is reduced, sublimation of the byproduct may be more easily processed.

In other example embodiments, an inert gas may be supplied to the chamber in which the purge operation is being performed. In this case, sublimation of a byproduct may be more easily processed. In this case, the pressure for performing the dry cleaning operation and the purge operation may be maintained uniformly.

FIGS. 2A through 2H are cross-sectional views for explaining a method of manufacturing a semiconductor device of FIG. 1A according to an example embodiment of the inventive concepts. Hereinafter, like reference numerals denote like elements.

Figure 2A:
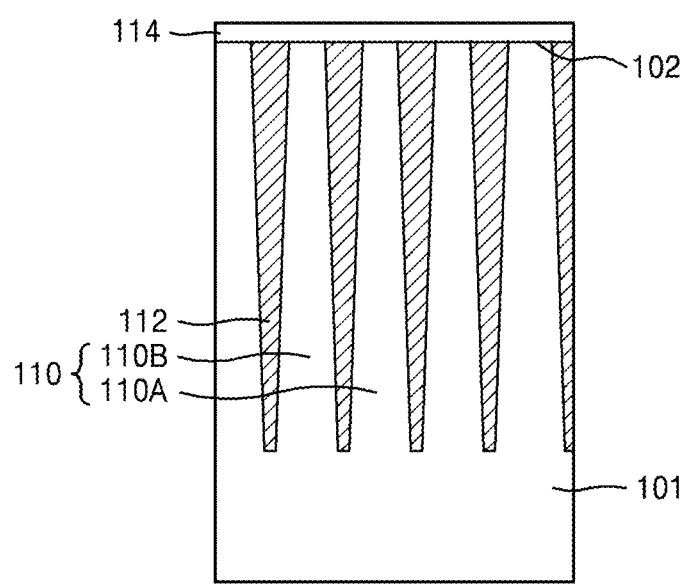
FIGS. 2A through 2H are cross-sectional views for explaining a method of manufacturing a semiconductor device according to an example embodiment of the inventive concepts.

Referring to FIG. 2A, a device isolation layer 112 is formed in a substrate 101 to define a plurality of active areas 110 including a first active area 110A and a second active area 110B. In some example embodiments, the substrate 101 may include a semiconductor material such as germanium (Ge), silicon carbide (SiC), gallium arsenide (GaAs), indium arsenide (InAs), and indium phosphide (InP). In some example embodiments, the substrate 101 may include an impurity-doped well or an impurity-doped structure.

In some example embodiments, the substrate 101 may have various device isolation structures such as a buried oxide layer (BOX) layer or a shallow trench isolation (STI) structure.

In some example embodiments, the device isolation layer 112 may include at least one of an oxide layer and a nitride layer. In some example embodiments, the device isolation layer 112 may be formed of a single layer formed of one type of an insulation layer or a multilayer formed of a combination of at least three types of insulation layers.

A first insulation layer 114 may be formed on an upper surface 102 of the substrate 101. In some example embodiments, the first insulation layer 114 may include at least one of an oxide layer and a nitride layer. In some example embodiments, the first insulation layer 114 may have a structure in which an oxide layer, a nitride layer, and an oxide layer are sequentially stacked.

Figure 2B:
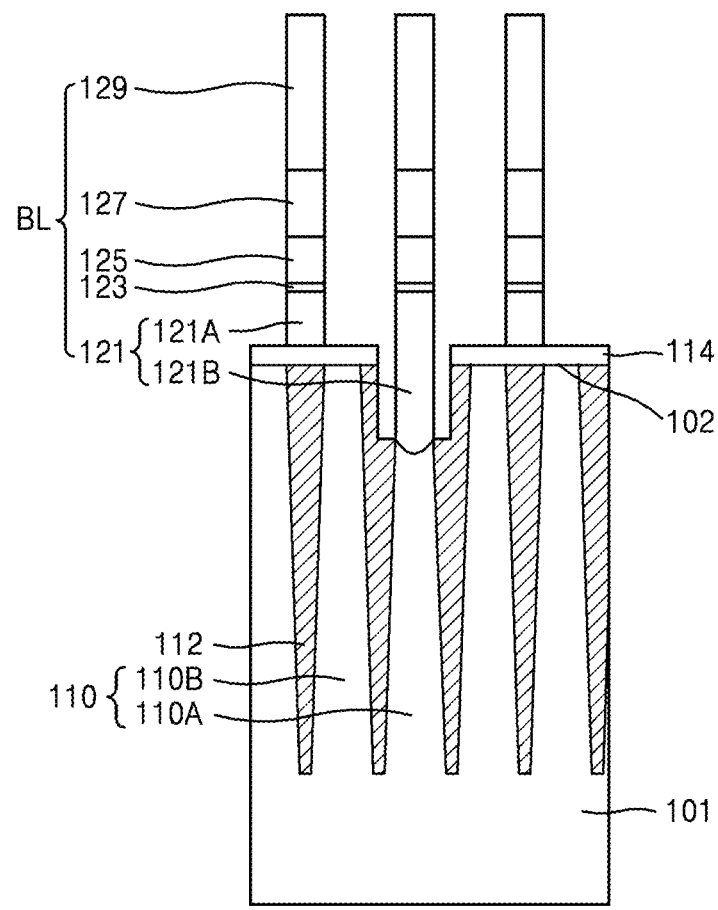

Referring to FIG. 2B, a first conductive structure BL is formed on a plurality of active areas 110 (operation S11 of FIG. 1A). The first conductive structure BL includes a first conductive layer 121A or a second conductive layer 121B, a third conductive layer 123, a fourth conductive layer 125, a capping layer 127, and an insulation layer 129. The second conductive layer 121B is connected to a first active area 110A. The first conductive layer 121A is not connected to a second active area 110B.

The first conductive structure BL including the second conductive layer 121B is connected to the first active area 110a at a lower level than a level of the semiconductor substrate 101. In some example embodiments, the first conductive layer 121A or the second conductive layer 121B may be silicon, doped polysilicon, or metal. In some example embodiments, the third conductive layer 123 and the fourth conductive layer 125 may each include at least one of titanium nitride (TiN), titanium silicon nitride (TiSiN), tungsten (W), and tungsten silicide. In some example embodiments, the first conductive layer 121A and the second conductive layer 121B may include doped polysilicon, the third conductive layer 123 may be include titanium silicon nitride, and the fourth conductive layer 125 may include tungsten, and the capping layer 127 may be formed of silicon nitride.

Although not illustrated in FIG. 2B, the first conductive structure BL is formed as follows. A first conductive layer having a given (or, alternatively predetermined) thickness is formed on the first insulation layer 114. A contact hole that passes through the first conductive layer and exposes a portion of the first active area 110a is formed, and the contact hole is filled with a second conductive layer. The entire upper surface of the resultant product is etched, and a third conductive layer, a fourth conductive layer, a capping layer, and a second insulation layer are sequentially formed on the first conductive layer and the second conductive layer.

The capping layer and the second insulation layer are patterned to form the first conductive structure BL. As a result, by using a capping pattern and a second insulation pattern as an etching mask, a plurality of the first conductive structures BL, in each of which the first conductive layer 121A, the second conductive layer 121B, the third conductive layer 123, the fourth conductive layer 125, the capping layer 127, and the second insulation layer 129 are sequentially stacked, are formed. The first conductive structure BL may be a bit line.

Figure 2C:
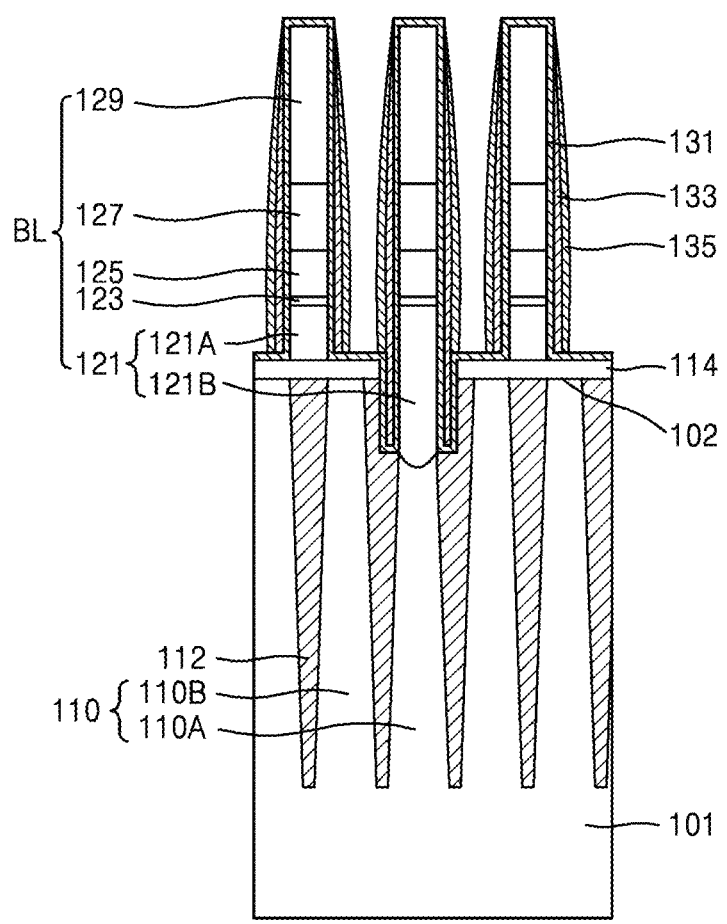

Referring to FIG. 2C, an insulation liner 131, a first insulation spacer 133, and a second insulation spacer 135 are formed on a sidewall of the first conductive structure BL (operation S12 of FIG. 1A). The first insulation spacer 133 and the second insulation spacer 135 may cover the insulation liner 131 formed on the sidewall of the first conductive structure BL and extend at a level that is lower than the upper surface 102 of the semiconductor substrate 101.

In some example embodiments, the insulation liner 131, the first insulation spacer 133, and the second insulation spacer 135 may each include at least one of a silicon oxide layer and a silicon nitride layer. In some example embodiments, the insulation liner 131 may include a nitride layer, the first insulation spacer 133 may include an oxide layer, and the second insulation spacer 135 may include a nitride layer.

Although the sidewall of the first conductive structure BL is illustrated to be covered by a triple layer in FIGS. 2A through 2H, the example embodiments of the inventive concepts are not limited thereto. In some example embodiments, the first conductive structure BL may be formed of a single layer or a plurality of layers. In some embodiment, the first conductive structure BL may be formed of a single oxide layer only. In some example embodiments, the insulation layer 131 and the second insulation spacer 135 formed on the sidewall of the first conductive structure BL may be relatively thin or the insulation liner 131 and the second insulation spacer 135 may not be formed.

Figure 2D:
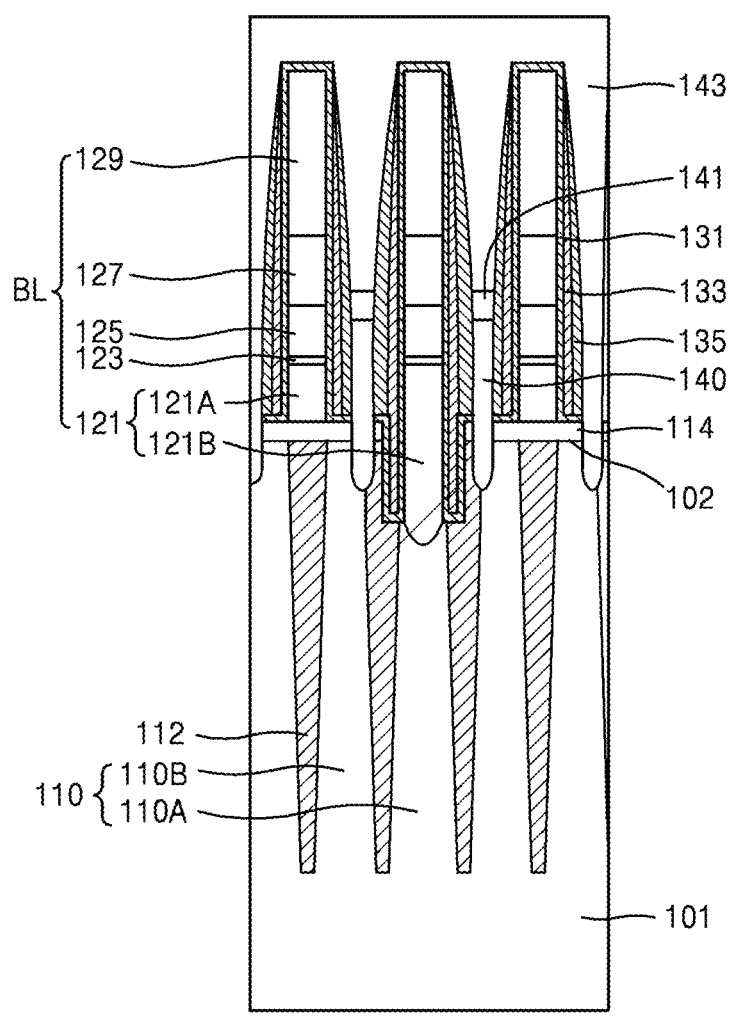

Referring to FIG. 2D, a plurality of buried contacts 140 are formed in spaces between the respective plurality of first conductive structures BL. A fifth conductive layer 143 is formed on a resultant product including the first conductive structures BL and the plurality of buried contacts 140.

Although not illustrated in FIG. 2D, the buried contacts 140 are formed as follows. A plurality of insulation patterns that define a plurality of holes used to form the buried contacts 140 are formed in spaces between the plurality of first conductive structures BL. The plurality of holes are formed to expose the second active area 110b. A portion of a lower portion of the plurality of holes is filled with a material of the buried contacts 140, thereby forming the buried contacts 140.

A metal silicide layer 141 may be formed on the buried contacts 140. In some example embodiments, the metal silicide layer 141 may be formed of a cobalt silicide. A barrier layer (not shown) may be formed on the metal silicide layer 141. The barrier layer may have a stacked structure formed of titanium and a titanium nitride.

Figure 2E:
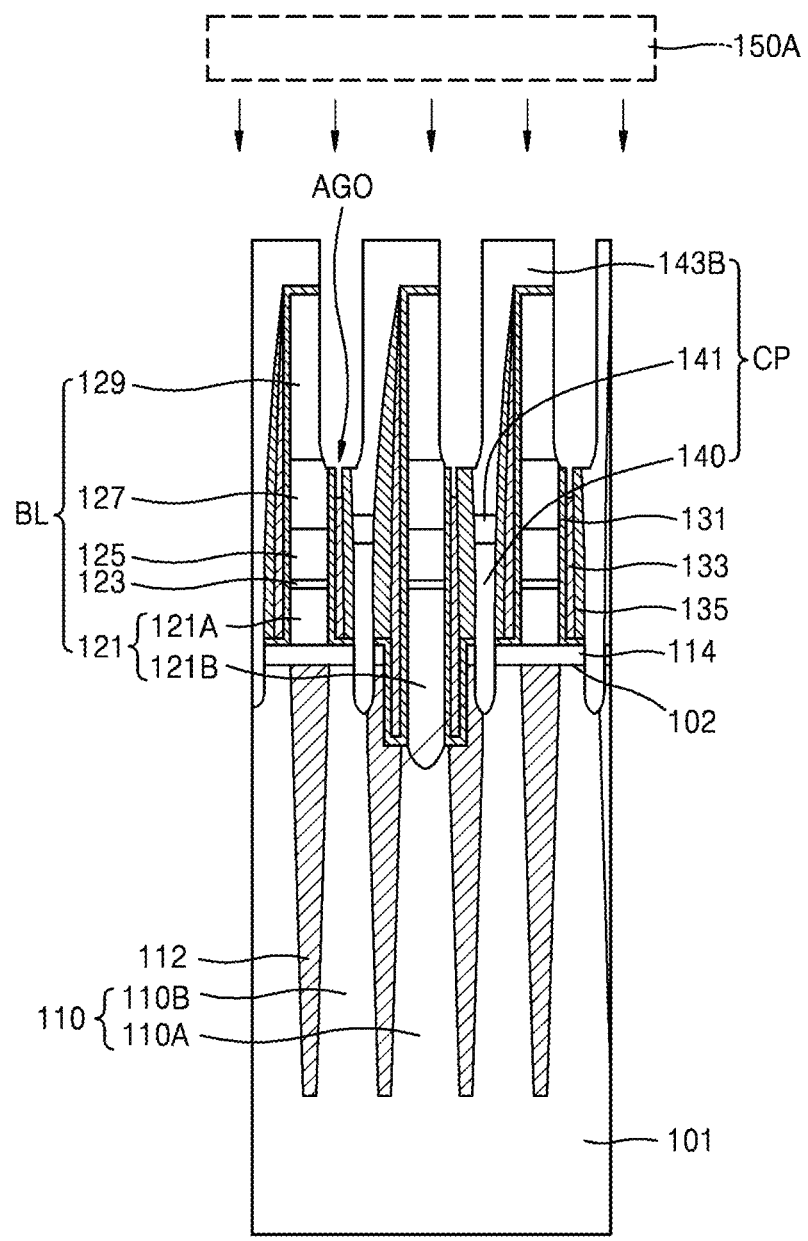

Referring to FIG. 2E, a mask pattern (not shown) is formed to form a landing pad 143B which exposes a portion of the first insulation spacer 133 and to which the buried contacts 140 are connected, and the mask pattern is used as an etching mask to etch the resultant product of FIG. 2D. As a result, the fifth conductive layer 143 of FIG. 2D is etched to form the landing pad 143B, and the first insulation spacer 133 of FIG. 2D is also etched so that an upper surface thereof is exposed outside. The buried contacts 140, the metal silicide layer 141, and the landing pad 143B may form a second conductive structure CP.

A first dry cleaning operation is performed to remove a portion of the first insulation spacer 133 of FIG. 2D that is exposed to the outside (operation S14 of FIG. 1A). The first dry cleaning operation is performed by supplying a first cleaning gas 150A that reacts with the first insulation spacer 133 so as to remove the portion of the first insulation spacer 133 of FIG. 2D by a chemical reaction between the first insulation spacer 133 and the first cleaning gas 150A. The first insulation spacer 133 is selectively etched by using the first dry cleaning operation, compared to peripheral layers. Thus, the first insulation spacer 133 is formed between the first conductive structures BL and the buried contacts 140, and an opening AG0 of an air gap is formed on the first insulation spacer 133.

In some example embodiments, the first cleaning gas 150A may include at least one of $NH_3$, HF, $H_2$, $NF_3$, and IPA (isopropyl alcohol) according to a type of the first insulation spacer 133. In some example embodiments, the first cleaning gas 150A may be a plasma-less gas. In some example embodiments, the first cleaning gas 150A may further include an inert gas such as $N_2$ or Ar.

When a wet cleaning operation is performed in the vicinity of a conductive structure including a bonding structure of different conductive materials, the bonding structure of different conductive materials comes in contact with an electrolyte, and thus, galvanic corrosion is produced in layers of the conductive structure. Thus, forming an air gap at a position adjacent to the conductive structure including a bonding structure of different conducive materials is difficult without damaging the conductive material. However, when an air gap is formed by using a dry cleaning operation according to some example embodiments of the inventive concepts, a gas is used instead of a solution, and thus, galvanic corrosion is substantially not produced and layers of the conductive structure are not damaged. However, an aluminum silicon fluoride $((NH_4)_2SiF_6)$-based byproduct which is formed according to a dry cleaning operation may be formed.

Figure 2F:
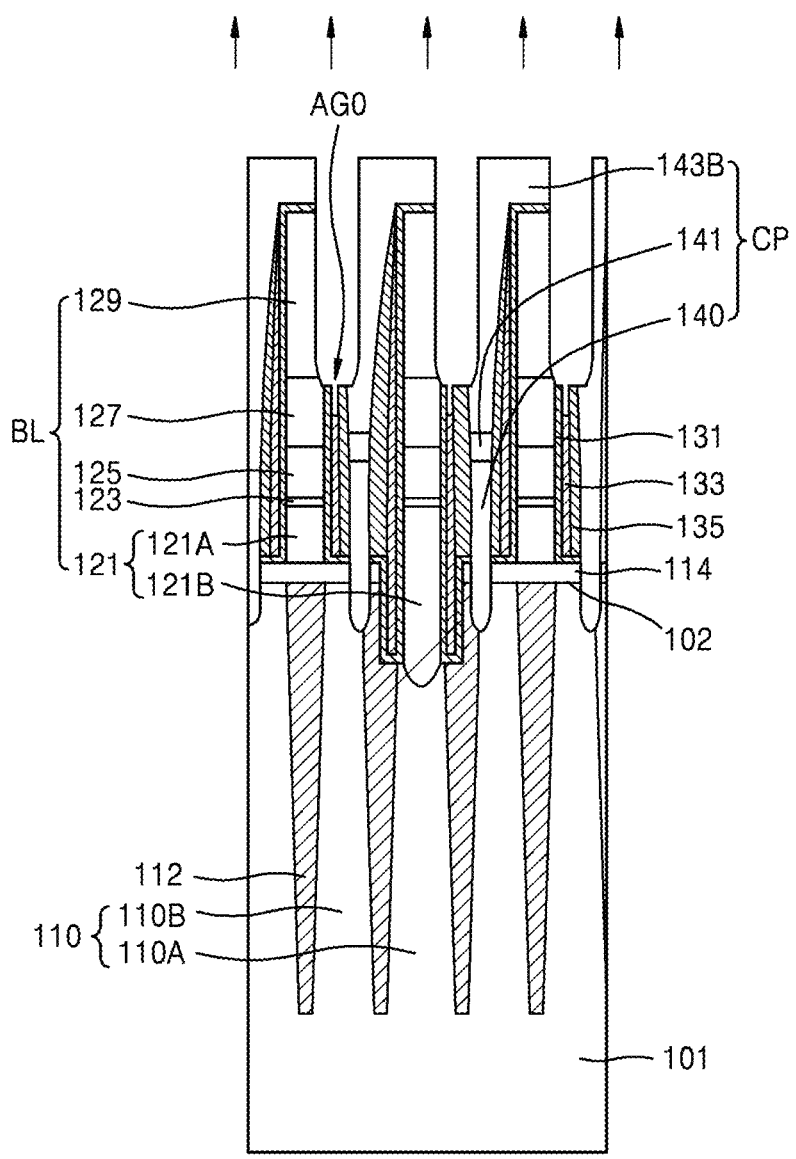

Referring to FIG. 2F, a purge operation is performed to remove a remaining gas of the first cleaning gas 150A and a byproduct generated as a result of the first dry cleaning operation (operation S15 of FIG. 1A). By removing the byproduct, early blocking of the opening of a material layer that is to be removed, due to the byproduct, may be prevented or inhibited. The purge operation provides a basis for removing the first insulation spacer 133 by a target width or depth.

In the purge operation, a byproduct formed by using a dry cleaning operation, for example, $(NH_4)_2SiF_6$, is removed. In some example embodiments, the purge operation may be performed at a high temperature of about 100° C. to about 300° C. and/or at a high vacuum degree of 0.000001 atm to 0.3 atm in order to facilitate sublimation of the byproduct. The conditions for the purge operation as above are characterized by removing a gas that does not react with the byproduct based on the conditions of the relatively high temperature or the relatively high vacuum degree compared to a dry cleaning condition.

Figure 2G:
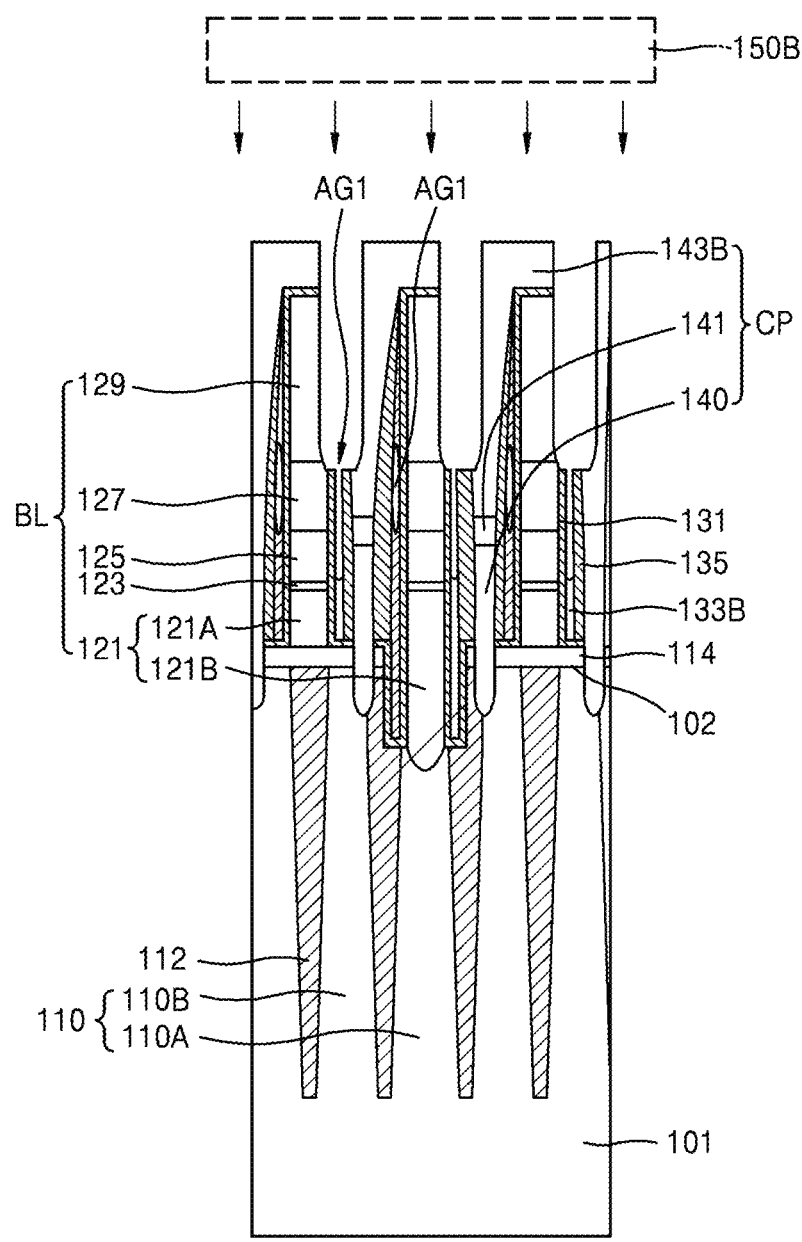

Referring to FIG. 2G, a portion of the remaining first insulation spacer 133 of FIG. 2F is removed by using a second dry cleaning operation (operation S16 of FIG. 1A) including a second cleaning gas 150B to form an air gap AG1 between the first conductive structure BL and the second conductive structure CP. The air gap AG1 is formed on a first insulation spacer 133B. In some example embodiments, the first cleaning gas 150A used in the first dry cleaning operation and a second cleaning gas 150B used in the second dry cleaning operation may be different or the same.

In some example embodiments, the first dry cleaning operation and the second dry cleaning operation may be performed simultaneously or at different times.

A purge operation is performed to remove a remaining gas of the second cleaning gas 150B used in the second dry cleaning operation and a byproduct generated as a result of the second dry cleaning operation (operation S17 of FIG. 1A). It may be determined whether the air gap AG1 has a target width or depth (operation S18 of FIG. 1A) and the second dry cleaning operation and the purge operation may be repeated until a portion or the whole of the first insulation spacer 133B is removed. As described above, according to some example embodiments of the inventive concepts, by alternately performing the purge operation and the dry cleaning operation, the opening of the air gap is not blocked early due to the reactant product and the byproduct, and thus, the air gap AG1 may be formed to be narrow and deep.

In some example embodiments, a width of the air gap AG1 may be 40 Å or less and a depth of the air gap AG1 may be 800 Å or greater.

Also, when the first and second dry cleaning operations (operations S13 and S15 of FIG. 1A) are performed at a relatively high temperature and/or a relatively high vacuum degree, the problems produced by the byproduct may be reduced, thereby reducing the number of times the dry cleaning operation is repeated and facilitates the formation of a relatively narrow and deep air gap.

In some example embodiments, the dry cleaning operation may be performed at a temperature of about 100° C. to about 300° C. When the dry cleaning operation is performed at a relatively high temperature, the generated byproduct is removed by sublimation, and thus, a relatively narrow and deep air gap may be formed.

In some example embodiments, the dry cleaning operation may be performed at a pressure of about 0.00001 atm to about 0.3 atm. When the dry cleaning operation is performed at a relatively high vacuum degree, the generated byproduct is removed by sublimation, and thus, a relatively narrow and deep air gap may be formed.

In some example embodiments, the method of manufacturing a semiconductor device may be used to form a trench, a hole, or a liner structure at a relatively high temperature and/or at a relatively high vacuum degree. That is, a semiconductor device including an air gap in the form of a trench, a hole, or a liner structure may be manufactured.

Figure 2H:
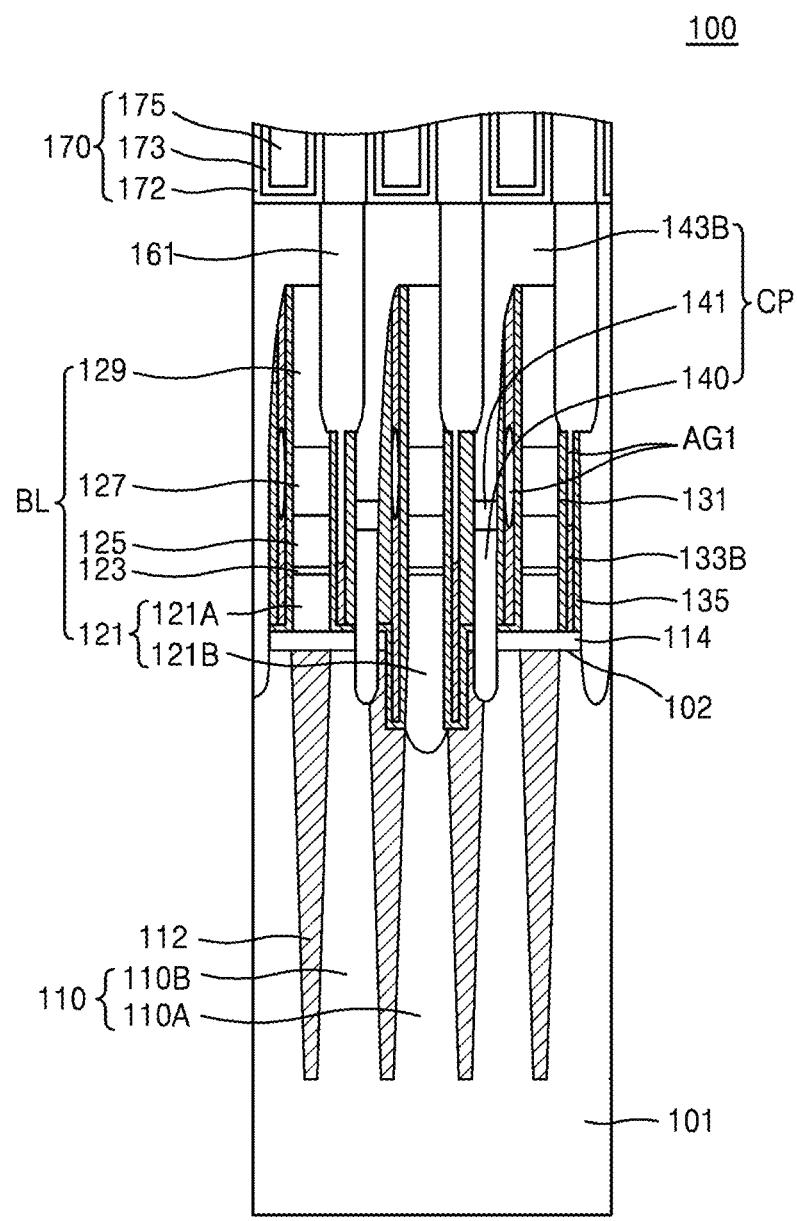

Referring to FIG. 2H, a third insulation layer 161 that defines the landing pad 143B and covers the opening of the air gap AG1 is formed. As a width of the air gap AG1 is relatively small, the third insulation layer 161 merely blocks the opening of the air gap AG1 but may not penetrate into the air gap AG1. The landing pad 143B may be connected to a capacitor 170. The capacitor 170 includes a bottom electrode 172, a dielectric layer 173, and a top electrode 175.

A semiconductor device 100 including an air gap may be manufactured by using the operations of FIGS. 2A through 2H as described above.

Although a dry cleaning operation is performed twice in the operations of FIGS. 2A through 2H, the example embodiments of the inventive concepts are not limited thereto. Thus, the method of manufacturing a semiconductor device according to the example embodiments of the inventive concepts may include a multi-cycle dry cleaning operation in which a dry cleaning operation and a purge operation are repeated three or more times.

Figure 3:
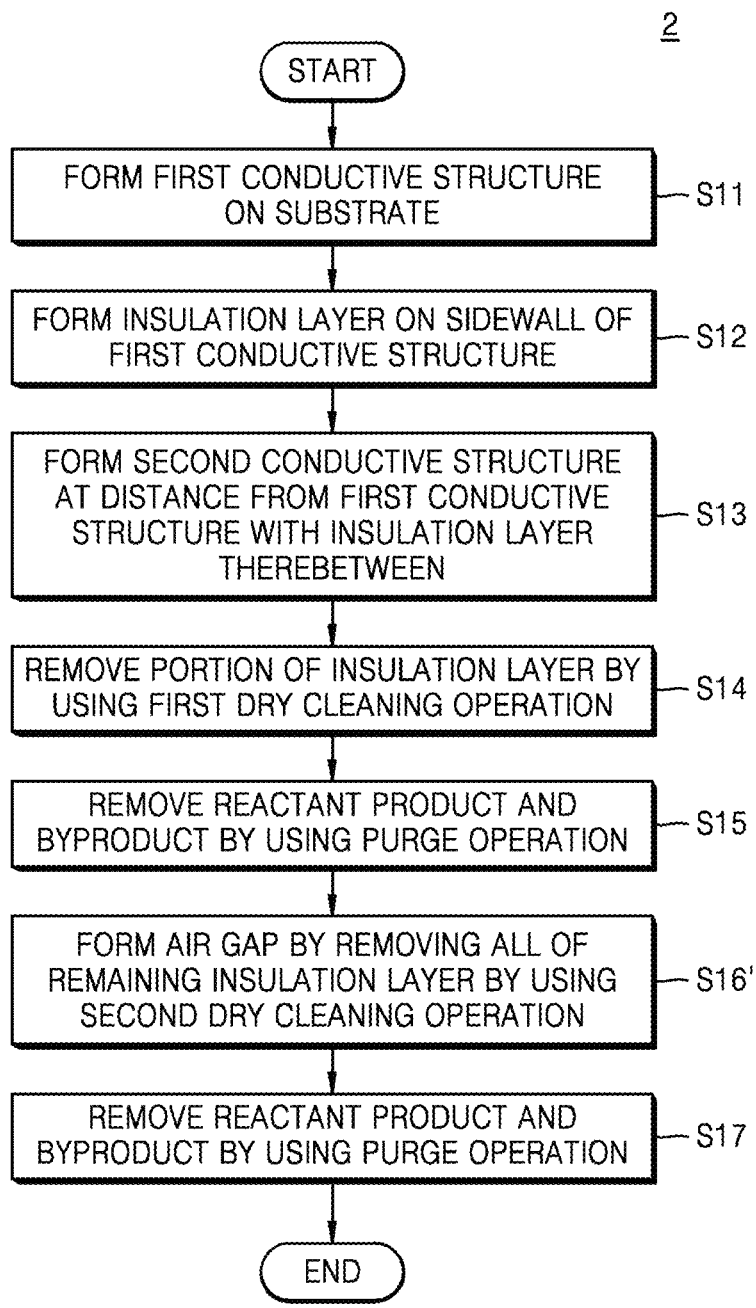
FIG. 3 is a flowchart of a method of manufacturing a semiconductor device according to another example embodiment of the inventive concepts.

FIG. 3 is a flowchart of a method 2 of manufacturing a semiconductor device according to another example embodiment of the inventive concepts.

Referring to FIG. 3, the method 2 as illustrated in FIG. 3 is similar to the method 1 as illustrated in FIG. 1A but is different in that the entire insulation spacer is removed in the second dry cleaning operation to form an air gap.

According to the method 2, a first conductive structure is formed in operation S11, an insulation spacer is formed on a sidewall of the first conductive structure in operation S12, and a second conductive structure is formed at a distance from the first conductive structure while including the insulation spacer therebetween in operation S13. A first dry cleaning operation is performed to remove a portion of the insulation spacer in operation S14, and a purge operation is performed to remove a reactant product and a byproduct that remain as a result of the first dry cleaning operation in operation S15. A second dry cleaning operation of completely removing the insulation spacer may be performed to form a relatively narrow and deep air gap in operation S16'. A purge operation may be performed to remove a reactant product and a byproduct that remain as a result of the second dry cleaning operation in operation S17.

Figure 4:
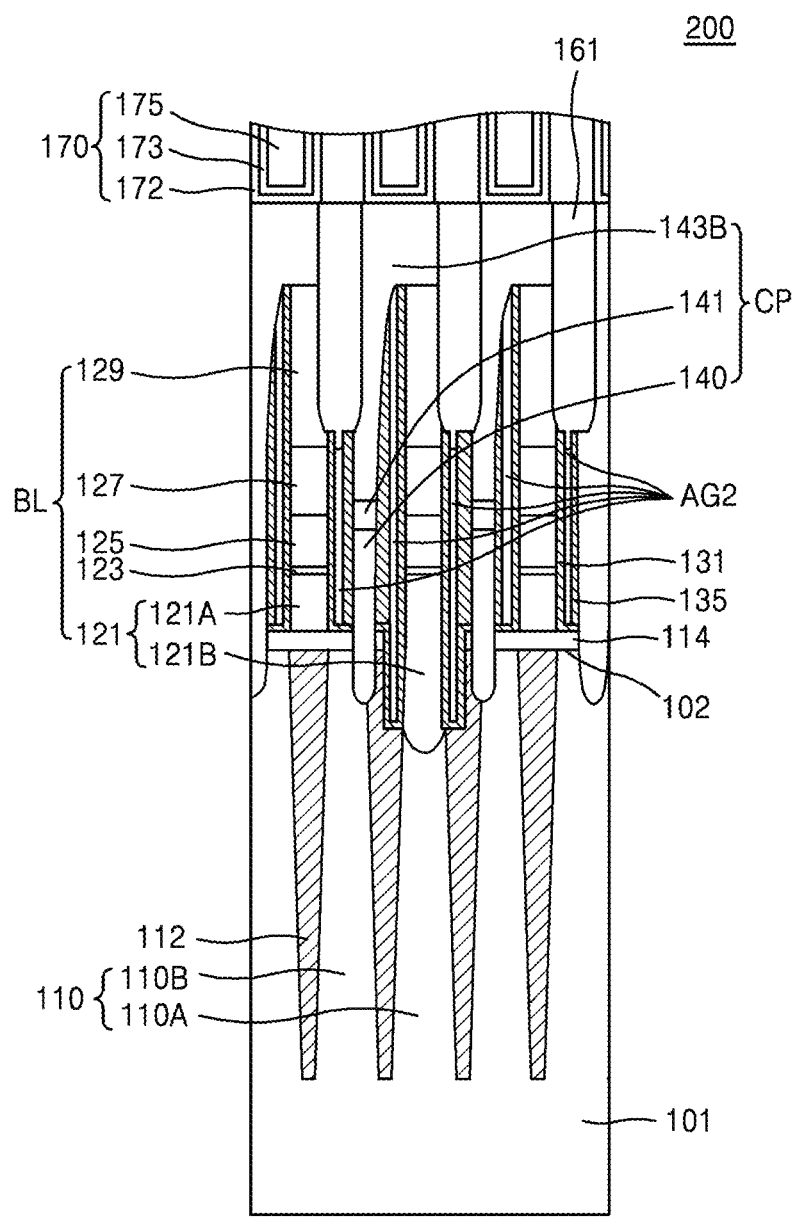
FIG. 4 is a cross-sectional view for explaining a method of manufacturing a semiconductor device according to another example embodiment of the inventive concepts.

FIG. 4 is a cross-sectional view of a semiconductor device 200 manufactured according to the method 2 of manufacturing a semiconductor device of FIGS. 2A-2H, according to another example embodiment of the inventive concepts.

Referring to FIG. 4, in the resultant product obtained by performing the same operations as the operations of FIGS. 2A through 2F (operations S21, S22, S23, S24, and S25 of FIG. 3), a second dry cleaning operation of completely removing a remaining portion of the first insulation spacer 133 may be performed to form an air gap AG2 (operation S26 of FIG. 3). Although not illustrated in FIG. 4, like FIG. 2G, the first insulation spacer 133B is removed by using the second cleaning gas 150B. However, unlike in the method of manufacturing a semiconductor device of FIGS. 2A through 2H, in which the air gap AG1 is formed by removing a portion of the remaining first insulation spacer 133A, the remaining first insulation spacer 133B is completely removed to form the air gap AG2 in the present example embodiment. Accordingly, the second dry cleaning operation of the method 2 may be longer than the second dry cleaning operation of the method 1. As described above, in order to reduce disturbance by the byproduct with respect to formation of the air gap, the second dry cleaning operation may be performed at a relatively high temperature and/or a relatively high vacuum degree. The operational difference may be selected according to necessity such as a process period and a size of a target air gap.

After forming the air gap AG2, the semiconductor device 200 may be manufactured according to the same operation as the operation of FIG. 2H. That is, the third insulation layer 161 is formed to define the landing pad 143B and to cover an opening of the air gap AG2. As a width of the air gap AG2 is relatively small, the third insulation layer 161 blocks only the opening of the air gap AG2 but does not penetrate into the air gap AG2. The landing pad 143B is connected to the bottom electrode 171 of the capacitor 170.

The semiconductor device 200 including an air gap may be manufactured according to the operations of FIGS. 2A through 2F and FIG. 4.

Figure 5:
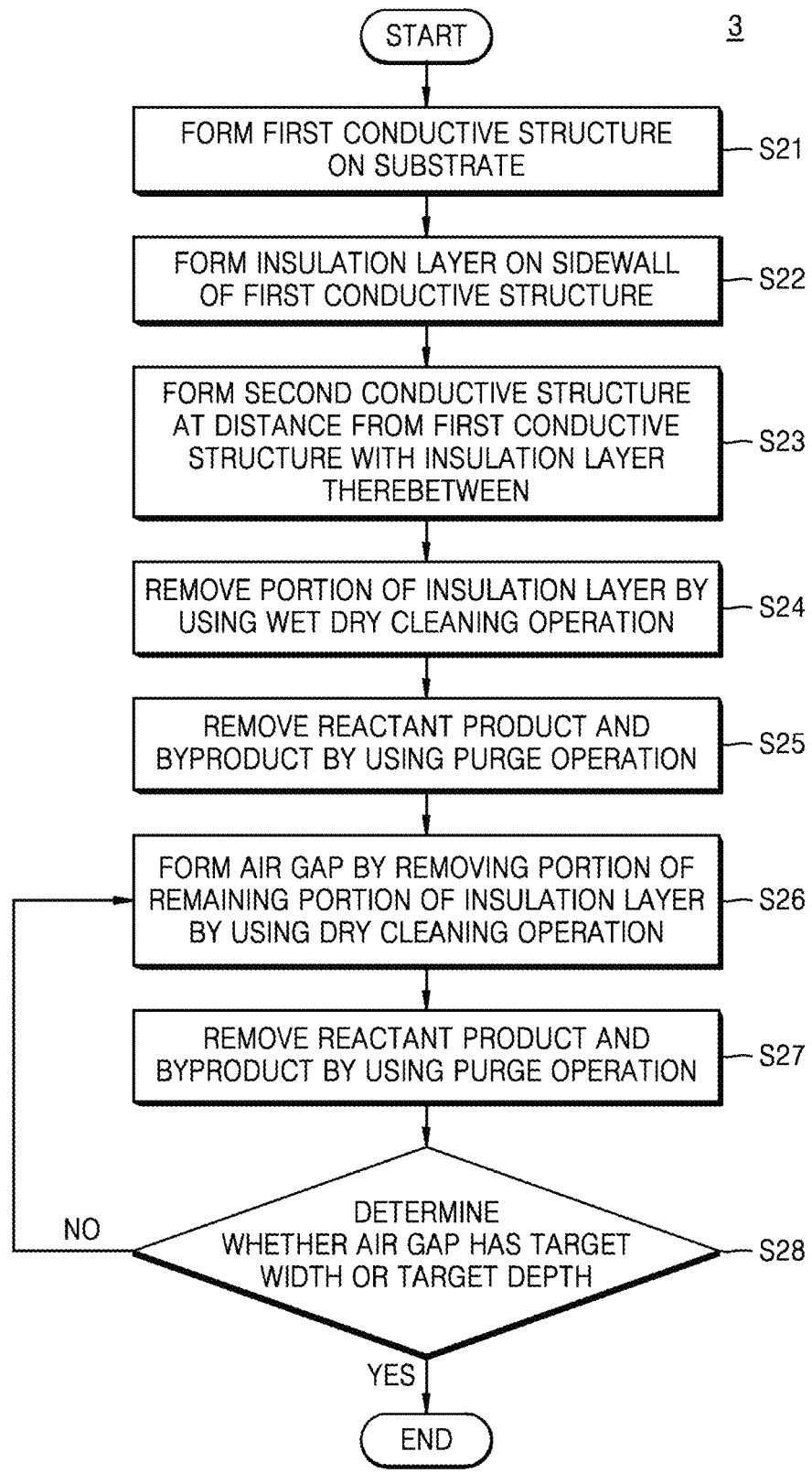
FIG. 5 is a flowchart of a method of manufacturing a semiconductor device according to still another example embodiment of the inventive concepts.

FIG. 5 is a flowchart of a method 3 of manufacturing a semiconductor device according to still another example embodiment of the inventive concepts.

Referring to FIG. 5, the method 3 is similar to the method 1 of FIG. 2 but is different in that an opening of an air gap is formed by using a wet cleaning operation instead of the first dry cleaning operation.

According to the method 3, a first conductive structure is formed on a substrate S21, an insulation spacer is formed on a sidewall of the first conductive structure in operation S22, and a second conductive structure is formed at a distance from the first conductive structure while including the insulation spacer therebetween in operation S23. A wet cleaning operation is performed to remove a portion of an upper portion and a center portion of the insulation spacer in operation S24. The wet cleaning operation is performed by using a cleaning solution to remove the above-described portions, and an opening of an air gap to be formed later may be formed by the wet cleaning operation. The cleaning solution and a byproduct that remain as a result of the wet cleaning operation are removed by performing a purge operation in operation S25. An air gap may be formed by performing a dry cleaning operation of removing a portion of a remaining portion of the insulation spacer in operation S26 and removing a reactant product and a byproduct remaining as a result of the dry cleaning operation in operation S27. Then, it is determined whether the air gap has a target width or depth in operation S28 and operation S26 of the dry cleaning operation and operation S27 of the purge operation may be repeated if required to thereby form an air gap having a target width and a target depth.

Figure 6:
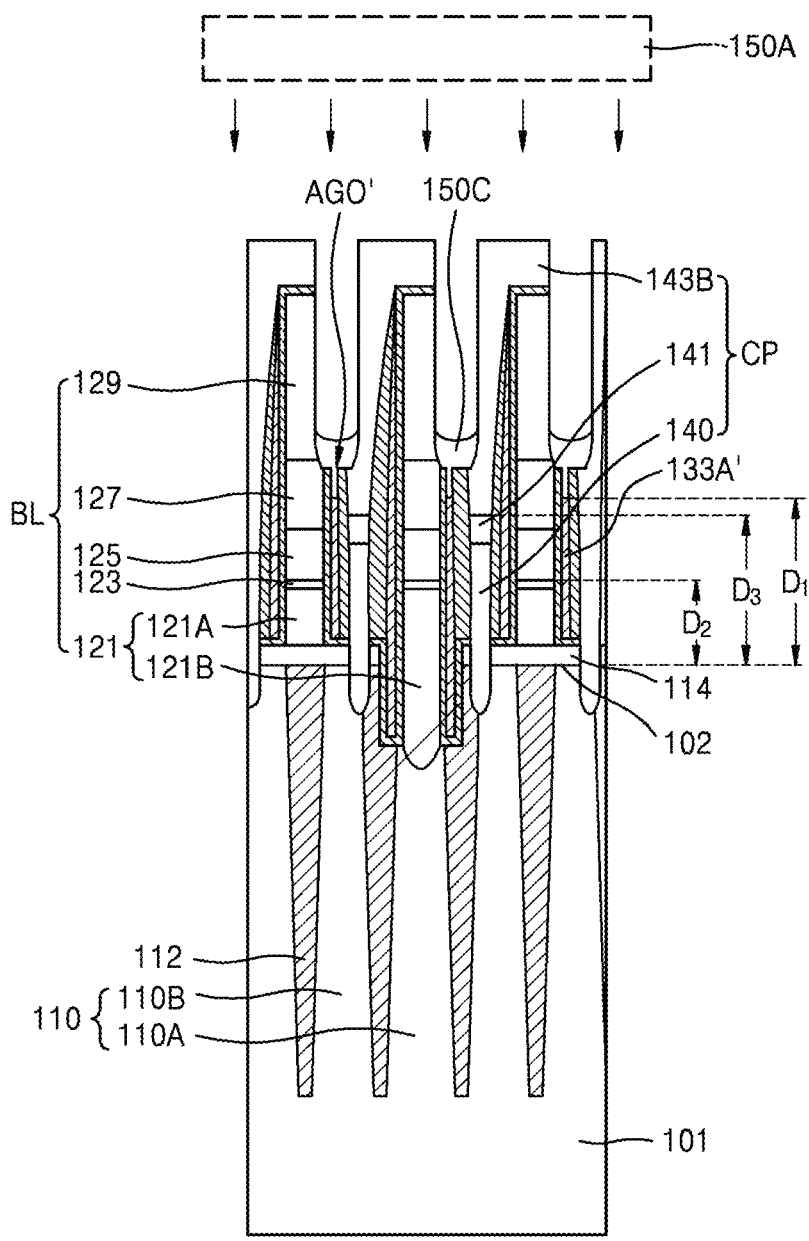
FIG. 6 is cross-sectional view for explaining a method of manufacturing a semiconductor device according still another example embodiment of the inventive concepts.

FIG. 6 is cross-sectional view for explaining the method 3 of manufacturing a semiconductor device of FIG. 5 according to some example embodiments of the inventive concepts.

Referring to FIG. 6, after obtaining the resultant product by performing the operations of FIGS. 2A through 2D (operations S21, S22, and S23 of FIG. 3), the resultant product of FIG. 2D is etched to form a landing pad 143B that exposes a portion of the first insulation spacer 133 of FIG. 2D and that is connected to the buried contacts 140. As a result, the fifth conductive layer 143 of FIG. 2D is etched to form the landing pad 143B of FIG. 6, and the first insulation spacer 133 of FIG. 2D is also etched so that an upper surface thereof is exposed to the outside. Then, a wet cleaning operation is performed on the entire surface of the resultant product in which the first insulation spacer 133 of FIG. 2D is exposed, thereby removing a portion of an upper portion of the first insulation spacer 133A of FIG. 2D (operation S24 of FIG. 3). In the wet cleaning operation, a cleaning solution 150C that reacts with the first insulation spacer 133A' is used so to remove the first insulation spacer 133A' by a chemical reaction between the first insulation spacer 133A' and the cleaning solution 150C.

In some example embodiments, the cleaning solution 150C may include at least one of $H_2SO_4$, $H_2O_2$, HF, $NH_4OH$, HCl, $NH_4F$, $H_3PO_4$, and $HNO_3$ according to a type of the first insulation spacer 133A'.

However, when an air gap is formed between conductive structures by using a wet cleaning operation as described above, a bonding structure of different conductive materials comes in contact with an electrolyte, and thus, galvanic corrosion is produced in layers of the conductive structure. Thus, in some example embodiments, with respect to the upper surface 102 of the substrate 101 as a measurement standard, a level D1 of an upper surface of the first insulation spacer 133A' which is removed by using the wet cleaning operation may be higher than a level D2 or D3 of bonding interfaces of different conductive materials in the first conductive structure BL and the second conductive structure CP. In this case, a relatively small amount of a byproduct is generated, and thus, a relatively narrow and deep air gap may be formed.

The same subsequent operations as the operations of FIGS. 2F through 2H are performed to manufacture a semiconductor device including an air gap. That is, referring to FIGS. 2F and 6, a purge operation is performed to remove a remaining solution of the cleaning solution 150C used in the wet cleaning operation and a byproduct generated as a result of the wet cleaning operation (operation S25 of FIG. 3). Then, the dry cleaning operation of FIGS. 2G and 2H (operation S26 of FIG. 3), the purge operation (operation S27 of FIG. 3), and the determining whether to repeat the dry and wet cleaning operations (operation S28 of FIG. 3) may be performed to thereby form a structure that is similar to the semiconductor device 100 or 200.

Figure 7:
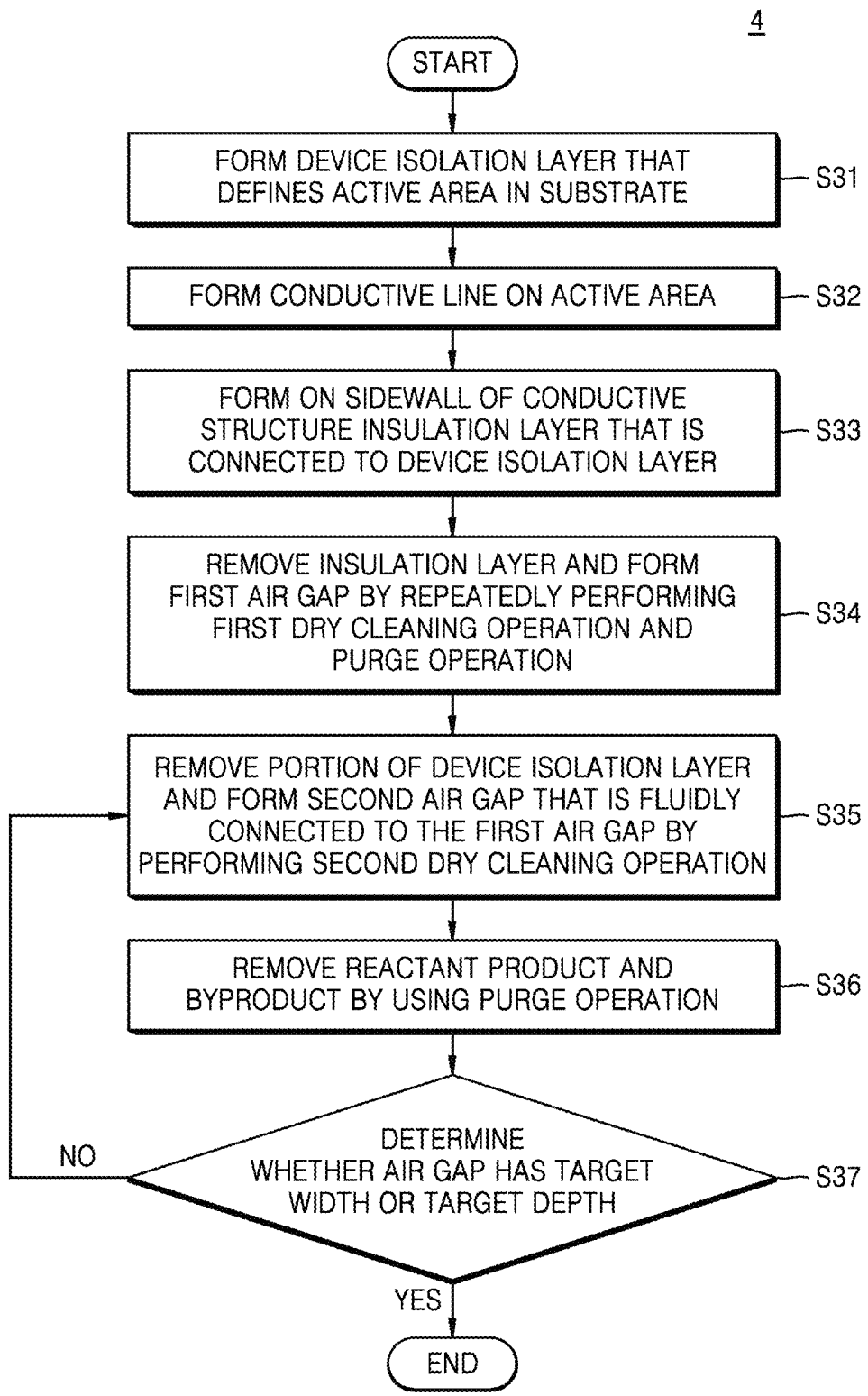
FIG. 7 is a flowchart of a method of manufacturing a semiconductor device according to yet another example embodiment of the inventive concepts.

FIG. 7 is a flowchart of a method 4 of manufacturing a semiconductor device according to yet another example embodiment of the inventive concepts.

Referring to FIG. 7, a device isolation layer that defines an active area in a substrate is formed in operation S31. A conductive structure that is connected to the active area is formed in operation S32, and an insulation spacer that is connected to the device isolation layer is formed on a sidewall of the conductive structure in operation S33. The insulation spacer is formed in order to use the insulation spacer as a path to sequentially clean the insulation spacer and the device isolation layer when forming an air gap in the device isolation layer. A first dry cleaning operation and a purge operation may be repeatedly performed to completely remove the insulation spacer and a first gap is formed in a space, in which the insulation spacer has been, in operation S34. A second dry cleaning operation and a purge operation are repeatedly performed to remove a portion of the device isolation layer and a second air gap that is fluidly connected to the first air gap is formed in operation S35. Then, a purge operation, in which a reactant product and a byproduct remaining as a result of the dry cleaning operation are removed, may be performed in operation S36, and whether the second air gap has a target width or depth may be determined in operation S37 to repeatedly perform the dry cleaning operation of operation S35 and the purge operation of operation S36, thereby manufacturing a semiconductor device including an air gap.

Figure 8A:
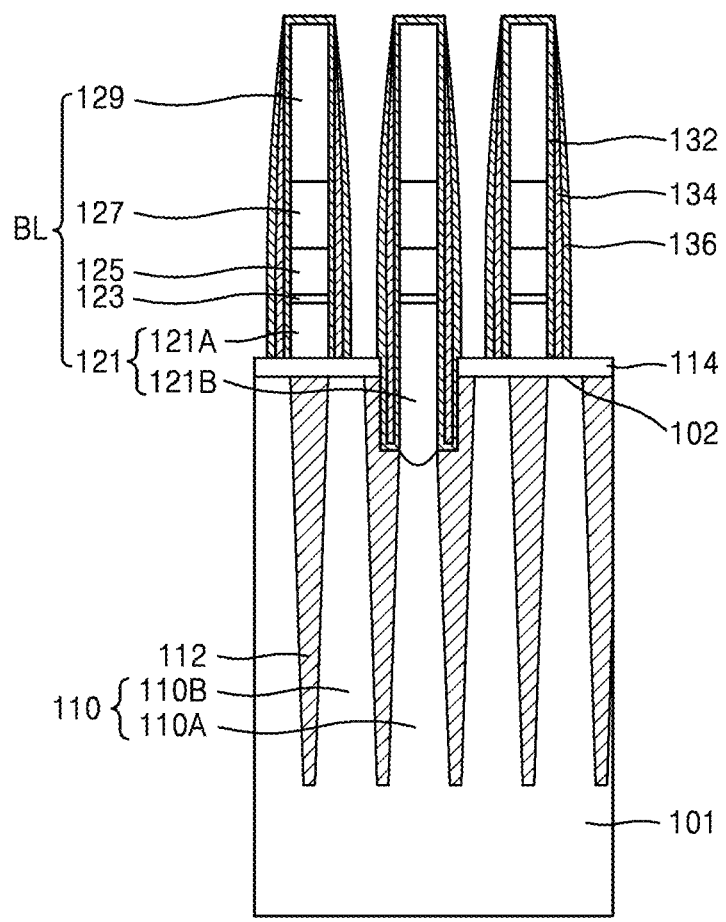
FIGS. 8A through 8C are cross-sectional views for explaining a method of manufacturing a semiconductor device according to yet another example embodiment of the inventive concepts.
Figure 8B:
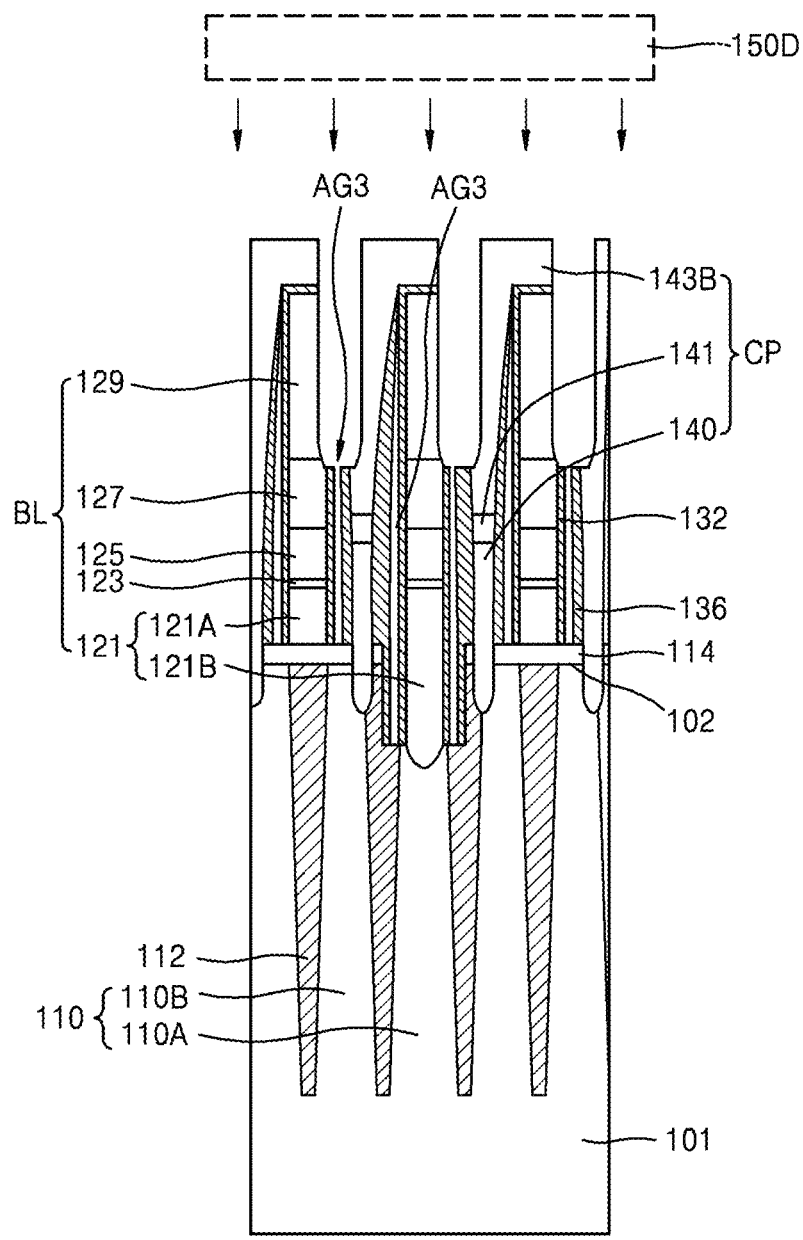
Figure 8C:
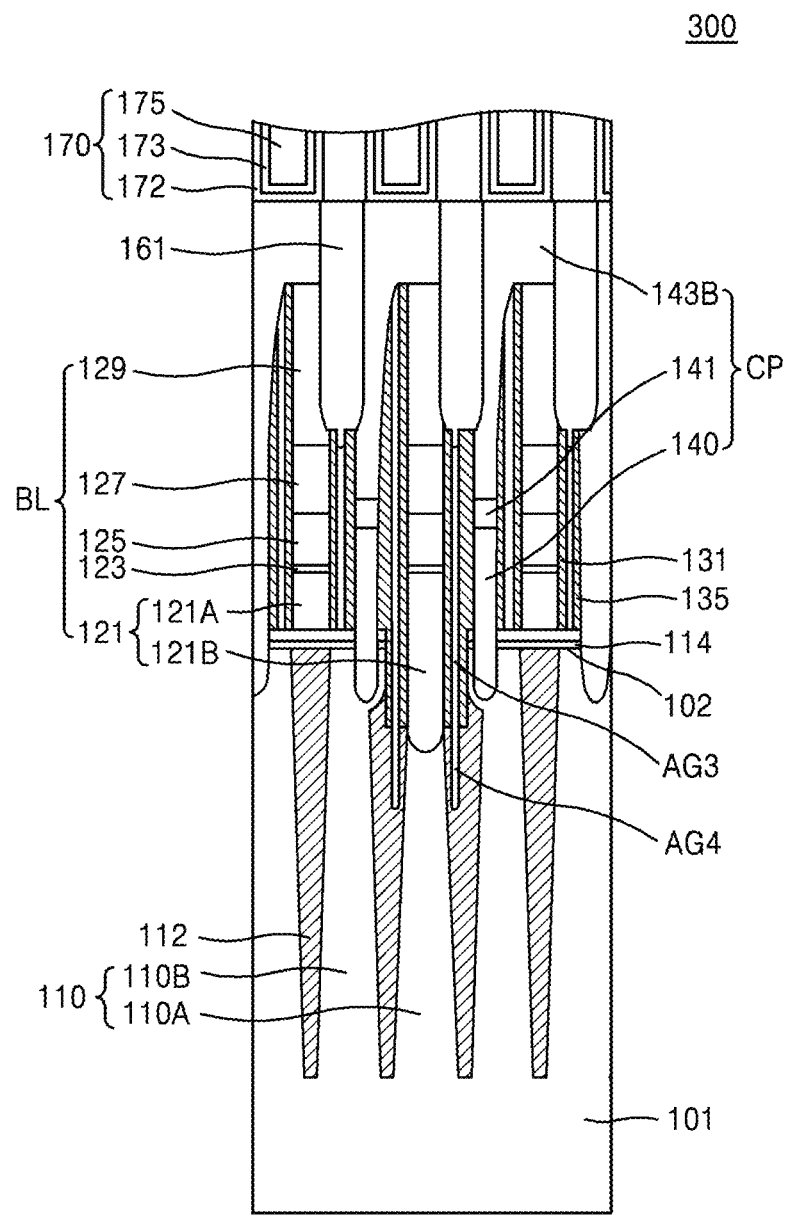

FIGS. 8A through 8C are cross-sectional views for explaining the method 4 of FIG. 7 of manufacturing a semiconductor device according to some example embodiments of the inventive concepts.

Referring to FIG. 8A, a first insulation spacer 132, a second insulation spacer 134, and a third insulation spacer 136 are formed (operation S33 of FIG. 7) on a sidewall of the first conductive structure BL of the resultant product obtained by performing the same operations as the operations of FIGS. 2A and 2B (operations S31 and S32 of FIG. 7). Unlike the methods 1, 2, and 3 of manufacturing a semiconductor device described above, no insulation liner is formed on the entire surface of the resultant product, on which the first conductive structure BL is formed, but the first through third insulation spacers 132, 134, and 136 are formed only on the sidewall of the first conductive structure BL. All of the first through third insulation spacers 132, 134, and 136 extend at a lower level than the upper surface 102 of the semiconductor substrate 101 to be connected to the device isolation layer 112.

Although all of the first through third insulation spacers 132, 134, and 136 are illustrated to be connected to the device isolation layer 112 in FIG. 8A, the example embodiments of the inventive concepts are not limited thereto. In some example embodiments, a semiconductor device may be manufactured such that at least one of the first through third insulation spacers 132, 134, and 136 is connected to the device isolation layer 112. In this case, an insulation spacer connected to the device isolation layer 112 may include the same material as the device isolation layer 112. Materials of the device isolation layer 112 and the first through third insulation spacers 132, 134, and 136 are as described above. In some example embodiments, the first through third insulation spacers 132, 134, and 136 may each include at least one of a silicon oxide layer, a silicon nitride layer, and a silicon nitride. In some example embodiments, the first insulation spacer 132 may include a nitride layer, the second insulation spacer 134 may include an oxide layer, and the third insulation spacer 136 may include a nitride layer.

While the sidewall of the first conductive structure BL is covered by a triple layer including the first through third insulation spacers 132, 134, and 136, the example embodiments of the inventive concepts are not limited thereto. In some embodiments, the first conductive structure BL may be covered by a plurality of insulation spacers including a single layer or a coupled layer, and at least one of the insulation spacers may be connected to the device isolation layer 112.

Referring to FIG. 8B, a plurality of buried contacts 140 are formed in spaces between the plurality of first conductive structures BL. A fifth conductive layer (not shown) is formed on the entire surface of a resultant product including the first conductive structures BL and the plurality of buried contacts 140. The method of forming the buried contacts 140 is as described above in detail. A metal silicide layer 141 may be formed on the buried contacts 140.

After forming the buried contacts 140, the resultant product of FIG. 8A is etched so as to form a landing pad 143B that exposes a portion of the second insulation spacer 134 and is connected to the buried contacts 140. As a result, the fifth conductive layer (not shown) is etched to form the landing pad 143B, and the second insulation spacer 134 of FIG. 8A is also etched so as to expose an upper surface thereof to the outside.

A first dry cleaning operation, in which a third cleaning gas 150D is used, and a purge operation may be repeatedly performed. Consequently, the second insulation spacer 134 of FIG. 8A is completely removed so that a first air gap AG3 is formed in a space where the second insulation spacer 134 of FIG. 8A was located (operation S34 of FIG. 7). A portion of an upper surface of the device isolation layer 112 is exposed by the first air gap AG3.

Referring to FIG. 8C, a second dry cleaning operation, in which a cleaning gas (not shown) is used, and a purge operation are repeatedly performed to remove the portion of the device isolation layer 112 that is exposed through the first air gap AG3 to form a second air gap AG4 that is fluidly connected to the first air gap AG3 (operation S35 of FIG. 7). That is, the cleaning gas contacts the device isolation layer 112 by using the first air gap AG3 as a path, and the device isolation layer 112 is removed by reacting with the cleaning gas, thereby forming the second air gap AG4.

The subsequent operations are similar as described above. The third insulation layer 161 that defines the landing pad 143B and covers an opening of the first air gap AG3 is formed. As a width of the first air gap AG3 is relatively small, the third insulation layer 161 blocks only the opening of the first air gap AG3 but does not penetrate into the first air gap AG3. The landing pad 143B is connected to the bottom electrode 171 of the capacitor 170.

The semiconductor device 300 including an air gap may be manufactured according to the operations of FIGS. 2A and 2B and FIGS. 8A through 8C.

FIG. 9 is a flowchart of a method 5 of manufacturing a semiconductor device according to yet still another example embodiment of the inventive concepts.

Referring to FIG. 9, the method 5 is similar to the method 4 of FIG. 7 but is different in that a device isolation layer is completely removed in a second dry cleaning operation top form an air gap.

According to the method 5, a device isolation layer is formed in a substrate in operation S31, a conductive structure is formed on the active area in operation S32, and an insulation spacer connected to the device isolation layer is formed on a sidewall of the conductive structure in operation S33. A first dry cleaning operation and a purge operation are repeatedly performed to completely remove the insulation spacer, thereby forming a first air gap in operation S34. A second dry cleaning operation and a purge operation are repeatedly performed to completely remove the device isolation layer that is exposed through the first air gap and form a second air gap that is fluidly connected to the first air gap in operation S35'. A purge operation may be performed in operation S36, and the dry cleaning operation of operation S35' and the purge operation of operation S36 may be repeatedly performed until the air gap has a target width or a target depth in operation S37.

Figure 10:
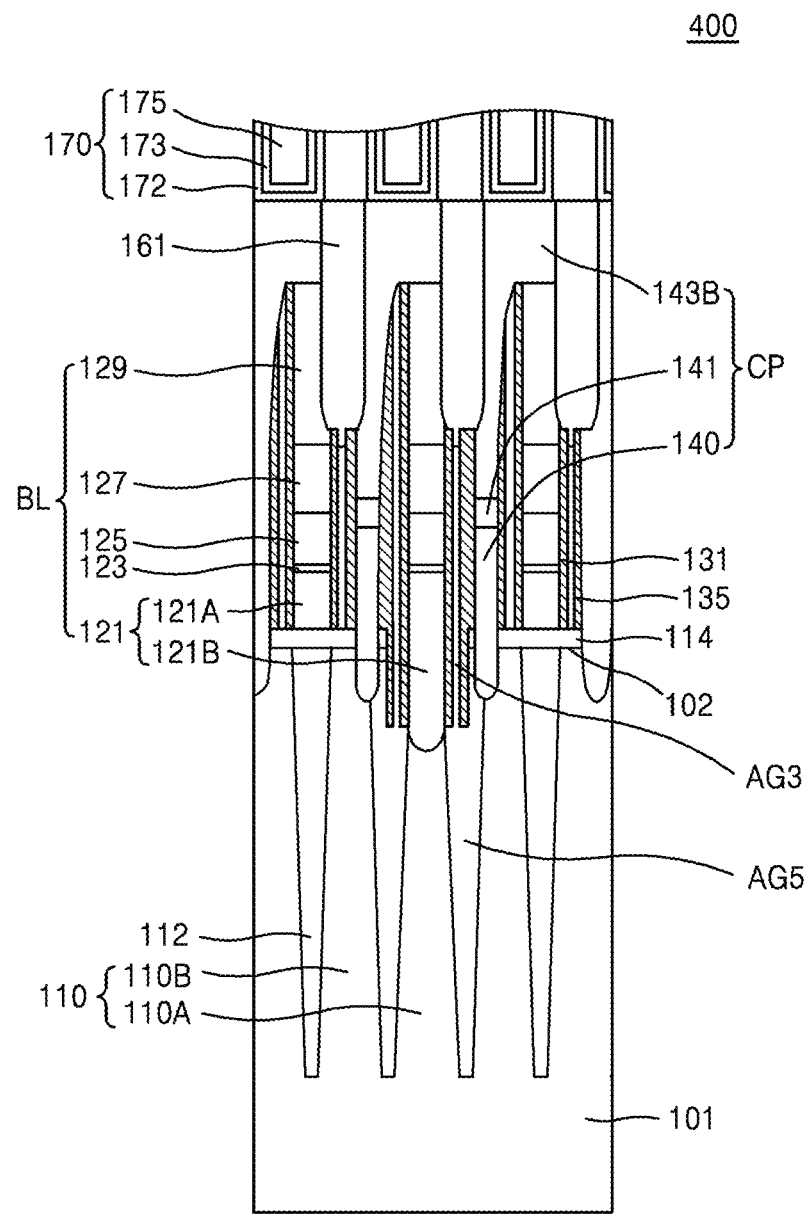
FIG. 10 is a cross-sectional view for explaining a method of manufacturing a semiconductor device according to yet still another example embodiment of the inventive concepts.

FIG. 10 is a cross-sectional view of the method 5 of manufacturing a semiconductor device 400 of FIG. 9 according to some example embodiments of the inventive concepts.

Referring to FIG. 10, in regard to the resultant product obtained by performing the same operations as the operations of FIGS. 2A, 2B, and 8A, unlike in FIG. 8B, a second dry cleaning operation of completely removing the remaining device isolation layer 112 may be performed to form an air gap AG5 (operation 35 of FIG. 9). Unlike the method 4 of manufacturing a semiconductor device of FIGS. 8A through 8C, the difference according to the present embodiment is that the remaining device isolation layer 112 is completely removed to form the air gap AG5. Accordingly, the second dry cleaning operation of the method 5 may be longer than the second dry cleaning operation of the method 4. In this case, in order to reduce disturbance by the byproduct with respect to formation of the air gap, the second dry cleaning operation may be performed at a relatively high temperature and/or a relatively high vacuum degree. The operational difference may be selected according to necessity such as a process period and a size of a target air gap.

After forming the air gap AG, the semiconductor device 400 may be manufactured according to the same operations as described above. That is, the third insulation layer 161 is formed to define the landing pad 143B and to cover an opening of the first air gap AG3. The landing pad 143B is connected to the bottom electrode 171 of the capacitor 170.

Figure 11A:
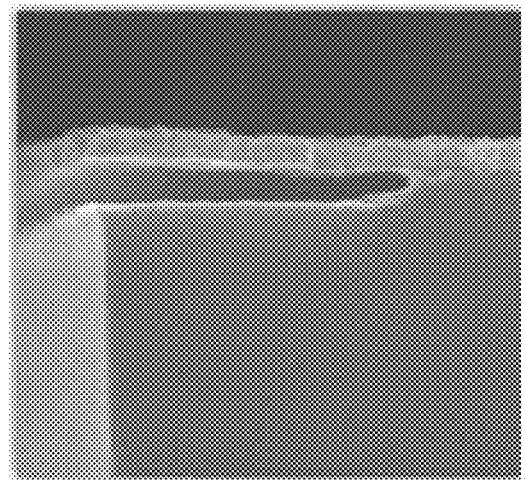
FIGS. 11A and 11B are respectively cross-sectional views of an air gap formed in a method of manufacturing a semiconductor device according to the related art and an air gap formed according to an example embodiment of the inventive concepts.
Figure 11B:
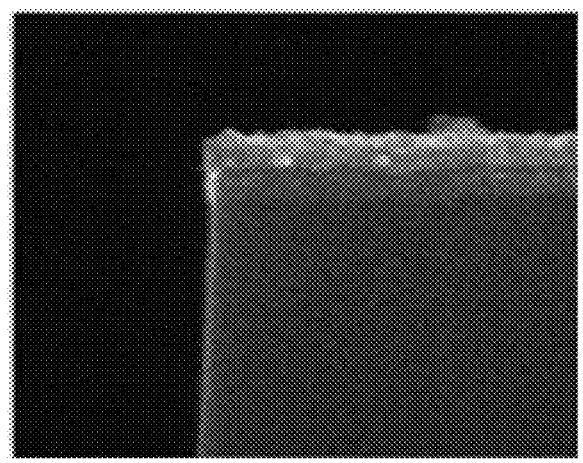

FIGS. 11A and 11B are respectively cross-sectional views of an air gap that is formed according to a method of manufacturing a semiconductor device according to the related art and of an air gap that is formed according to an example embodiment of the inventive concepts.

Referring to FIG. 11A, a conductive structure, in which a polysilicon 201, a metal silicide 203, and a metal 205 are sequentially stacked, is illustrated. When a wet cleaning operation is performed on the stack structure, the stack structure is damaged as the metal silicide is etched to a degree that is several hundred times greater than a standard etching amount.

Referring to FIG. 11B, like FIG. 11A, a conductive structure is illustrated, in which a polysilicon 211, a metal silicide 213, and a metal 215 are sequentially stacked from the bottom, is illustrated. However, unlike FIG. 11A, when a dry cleaning operation is repeatedly performed on the stack structure, the stack structure is not damaged even when the etching is performed for a time period that is ten times or more longer than a standard etching period. Thus, when a material layer adjacent to the conductive structure having a structure, in which different conductive materials are bonded, is to be removed, if dry cleaning and purging are repeatedly performed according to the example embodiments of the inventive concepts, the material layer may be completely removed without damaging the conductive structure.

In FIGS. 2A through 2H, 4, 6, 8A through 8C, and 10, the first conductive structure is a bit line, the second conductive structure is a buried contact, and an insulation layer interposed between the first and second conductive structures is an insulation spacer formed on a sidewall of the first conductive structure, and an air gap is formed at a position of the insulation spacer. However, the inventive concepts are not limited thereto. Although not illustrated in the drawings, a word line that overlaps the active area 110 may be formed on the first insulation layer 114. In some example embodiments, the first conductive structure may be the word line, the second conductive structure may be the substrate 101, and an insulation layer formed between the first and second conductive structures may be the first insulation layer 114 interposed between the word line and the substrate 101. Accordingly, an air gap may be formed in the first insulation layer 114. In some example embodiments, the word line may be a buried word line formed below the substrate 101, and an air gap may be formed in a gate dielectric layer interposed between the substrate 101 and the buried word line according to the method of manufacturing a semiconductor device of the example embodiments of the inventive concepts.

Also, while the method of manufacturing a semiconductor device formed between conductive structures of a memory semiconductor device is illustrated in FIGS. 2A through 2H, 4, 6, 8A through 8C, and 10, the inventive concepts are not limited thereto. In some example embodiments, the inventive concepts may also be applied when forming an air gap between conductive structures of a non-memory semiconductor device.

Figure 12:
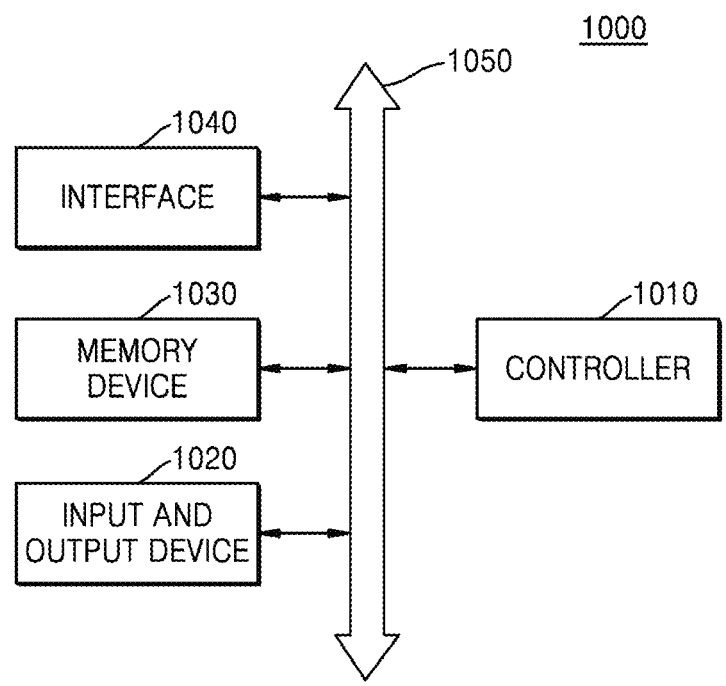
FIG. 12 illustrates a system including a semiconductor device manufactured according to an example embodiment of the inventive concepts.

FIG. 12 illustrates a system 1000 including the semiconductor device 100, 200, 300, or 400, including an air gap according to some example embodiments of the inventive concepts.

Referring to FIG. 12, the system 1000 may include a controller 1010, an input and output device 1020, a memory device 1030, and an interface 1040. The system 1000 may be a mobile system or a system that transmits or receives information. In some example embodiments, the mobile system may be, for example, a personal digital assistant (PDA), a portable computer, a web tablet, a wireless phone, a mobile phone, a digital music player, or a memory card. The controller 1010 is used to control an execution program in the system 1000 and may be formed of a microprocessor, a digital signal processor, a microcontroller, or a similar device thereto.

The input and output device 1020 may be used to input or output data of the system 1000. The system 1000 may be connected to an external device such as a personal computer or a network, by using the input and output device 1020, and may exchange data with the external device. The input and output device 1020 may be, for example, a keypad, a keyboard, or a display.

The memory device 1030 may store codes and/or data for an operation of the controller 1010 or may store data processed by the controller 1010. The memory device 1030 includes a semiconductor device including a fin-type field effect transistor according to the some example embodiments of the inventive concepts. For example, the memory device 1030 may include at least one semiconductor device from among the semiconductor devices 100, 200, 300, and 400 illustrated in FIGS. 8 through 10.

The interface 1040 may be a data transmission path between the system 1000 and another external device. The controller 1010, the input and output device 1020, the memory device 1030, and the interface 1040 may communicate with one another via a bus 1050. The system 1000 may be used in a mobile phone, a MP3 player, a navigation device, a portable multimedia player (PMP), a solid state disk (SSD), or household appliances.

Figure 13:
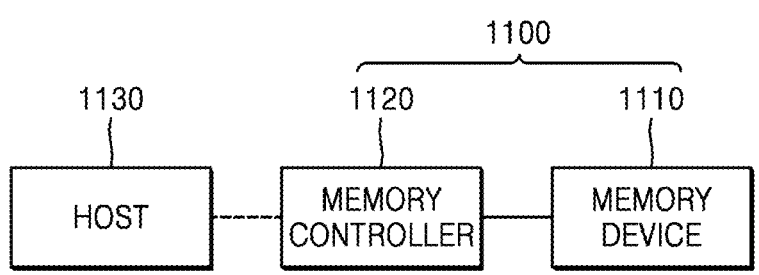
FIG. 13 is a memory card including a semiconductor device manufactured according to an example embodiment of the inventive concepts.

FIG. 13 is a memory card 1100 including the semiconductor device 100, 200, or 300 including an air gap formed according to an example embodiment of the inventive concepts.

Referring to FIG. 13, the memory card 1100 includes a memory device 1110 and a memory controller 1120.

The memory device 1110 may store data. In some example embodiments, the memory device 1110 may be nonvolatile so that data stored therein may be maintained even if a power supply is stopped. The memory device 1110 may include a semiconductor device according to some example embodiments of the inventive concepts. For example, the memory device 1110 includes at least one semiconductor device from among the semiconductor devices 100, 200, 300, and 400 illustrated in FIGS. 8 through 10.

The memory controller 1120 may read data stored in the memory device 1110 in response to a read or write request of a host 1130 or may store data of the memory device 1110. The memory controller 1120 may include a semiconductor device according to some example embodiments of the inventive concepts. For example, the memory device 1110 includes at least one semiconductor device from among the semiconductor devices 100, 200, 300, and 400 illustrated in FIGS. 8 through 10.

While the inventive concepts have been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
    forming a first conductive structure on a substrate;
    forming an insulation layer on a sidewall of the first conductive structure;
    forming a second conductive structure a distance apart from the first conductive structure with the insulation layer therebetween;
    first removing a portion of the insulation layer by performing a first dry cleaning operation;
    second removing a reactant product used in the first dry cleaning operation or a first byproduct generated as a result of the first dry cleaning operation by performing a first purge operation; and
    third removing at least a portion or all of the remaining insulation layer by performing a second dry cleaning operation to form an air gap between the first and second conductive structures.

2. The method of claim 1, wherein the third removing removes only a portion of the remaining insulating layer in the second dry cleaning operation, and the second dry cleaning operation and the first purge operation are repeatedly performed until the air gap has at least one of a target width and a target depth.

3. The method of claim 2, wherein the repeatedly performing the second dry cleaning operation and the first purge operation includes repeatedly supplying an etching gas and stopping the supply of the etching gas to sublimate a second byproduct generated as a result of the second dry cleaning operation and the first purge operation.

4. The method of claim 2, further comprising:
    determining whether removal of a second byproduct is required after the second dry cleaning operation; and
    performing a second purge operation at a temperature higher than a temperature of the second dry cleaning operation to sublimate the second byproduct if removal of the second byproduct is required.

5. The method of claim 1, wherein a temperature of the first purge operation is higher than a temperature of the second dry cleaning operation.

6. The method of claim 1, wherein the second removing performs the first purge operation while supplying an inert gas or at a pressure adjusted to be lower than a pressure of the first dry cleaning operation and the second dry cleaning operation.

7. The method of claim 1, wherein the third removing removes only a portion of the remaining insulation layer in the second dry cleaning operation such that the remaining portion of the insulation layer defines the air gap between the first and second conductive structures.

8. The method of claim 1, wherein at least one of the forming a first conductive structure and forming a second conductive structure forms a structure in which different conductive materials are bonded.

9. The method of claim 1, wherein the forming a first conductive structure forms a bit line, and the forming a second conductive structure forms a buried contact, further comprising:
    forming a landing pad pattern to expose the buried contact and a portion of the remaining insulation layer after the forming a buried contact,
    wherein the first dry cleaning operation and the second dry cleaning operation are performed after the forming a landing pad pattern.

10. The method of claim 1, wherein the first removing and the third removing uses a plasma-less gas.

11. The method of claim 1, wherein the first removing and the third removing uses a gas including at least one of $NH_3$, HF, $NF_3$, $H_2$, and IPA (isopropyl alcohol).

12. The method of claim 1, wherein the first removing and the third removing uses an inert gas.

13. The method of claim 1, further comprising:
    removing a portion of the insulation layer by performing a wet cleaning operation before the first removing.

14. The method of claim 13, wherein
    at least one of the forming a first conductive structure and the forming a second conductive structure forms a structure in which different conductive materials are stacked, and
    the removing a portion of the insulation layer by performing a wet cleaning operation forms a remaining insulation layer having an upper surface that is at a level higher than a level of bonding interfaces of the different conductive materials.

* * * * *